United States Patent
Liu et al.

(10) Patent No.: US 11,545,094 B2
(45) Date of Patent: Jan. 3, 2023

(54) SHIFT REGISTER, DISPLAY PANEL INCLUDING VOLTAGE RANGE ADJUSTMENT UNIT, DRIVING METHOD, AND DISPLAY DEVICE

(71) Applicant: SEEYA OPTRONICS CO., LTD., Shanghai (CN)

(72) Inventors: Ping-Lin Liu, Shanghai (CN); Tong Wu, Shanghai (CN)

(73) Assignee: SEEYA OPTRONICS CO., LTD., Shanghai (CN)

( * ) Notice: Subject to any disclaimer, the term of this patent is extended or adjusted under 35 U.S.C. 154(b) by 0 days.

(21) Appl. No.: 17/490,607

(22) Filed: Sep. 30, 2021

(65) Prior Publication Data

US 2022/0208102 A1 Jun. 30, 2022

(30) Foreign Application Priority Data

Dec. 31, 2020 (CN) .................. 202011626722.X

(51) Int. Cl.
*G09G 5/00* (2006.01)
*G09G 3/3266* (2016.01)
(Continued)

(52) U.S. Cl.
CPC .......... *G09G 3/3266* (2013.01); *G11C 19/28* (2013.01); *G09G 3/3208* (2013.01);
(Continued)

(58) Field of Classification Search
CPC ......... G09G 3/3266; G09G 2300/0842; G09G 2310/0286; G09G 2310/0291;
(Continued)

(56) References Cited

U.S. PATENT DOCUMENTS

2005/0093464 A1* 5/2005 Shin ................ G09G 3/3266
315/169.3
2005/0179677 A1* 8/2005 Nojiri .............. G09G 3/3614
345/204
(Continued)

FOREIGN PATENT DOCUMENTS

CN 1697008 A 11/2005
CN 1716369 A 1/2006
(Continued)

OTHER PUBLICATIONS

CN 20201162772.X, Jul. 27, 2022, Chinese Office Action.
Chinese Office Action dated Jul. 27, 2022, in connection with Chinese Application No. 202011626722.X.

*Primary Examiner* — Adam J Snyder
(74) *Attorney, Agent, or Firm* — Wolf, Greenfield & Sacks, P.C.

(57) ABSTRACT

Provided are a shift register, a display panel, a driving method, and a display device. The shift register includes a plurality of shift register units that are cascaded, where each of the plurality of shift register units includes a latch circuit, at least one scan switch circuit and at least one light emission control switch circuit; where the latch circuit is configured to, in response to a clock signal inputted by a clock signal input, latch an upper-stage shift signal inputted by an upper-stage shift signal input and output the upper-stage shift signal through a lower-stage shift signal output; each of the at least one scan switch circuit is configured to, in response to a lower-stage shift signal outputted by the lower-stage shift signal output, output a scan signal inputted by a scan signal input through a scan signal output.

17 Claims, 10 Drawing Sheets

(51) Int. Cl.
  *G11C 19/28*   (2006.01)
  *G09G 3/3233*   (2016.01)
  *G09G 3/3208*   (2016.01)
(52) U.S. Cl.
  CPC ... *G09G 3/3233* (2013.01); *G09G 2300/0819* (2013.01); *G09G 2300/0842* (2013.01); *G09G 2300/0861* (2013.01); *G09G 2310/0251* (2013.01); *G09G 2310/0286* (2013.01); *G09G 2310/0291* (2013.01); *G09G 2310/08* (2013.01)
(58) Field of Classification Search
  CPC ............. G09G 2310/08; G09G 3/3233; G09G 2300/0819; G09G 2300/0861; G09G 2310/0251; G11C 19/28
  See application file for complete search history.

(56) References Cited

U.S. PATENT DOCUMENTS

| | | | | |
|---|---|---|---|---|
| 2005/0264496 A1* | 12/2005 | Shin | ............. | G09G 3/3233 345/76 |
| 2006/0044230 A1 | 3/2006 | Eom | | |
| 2006/0103323 A1* | 5/2006 | Eom | ............. | G09G 3/3266 315/169.3 |
| 2006/0158394 A1* | 7/2006 | Choi | ............. | G09G 3/3266 345/76 |
| 2006/0248421 A1* | 11/2006 | Choi | ............. | G09G 3/3266 714/731 |
| 2007/0124633 A1* | 5/2007 | Kim | ............. | G09G 3/3266 714/726 |
| 2007/0229438 A1 | 10/2007 | Shin | | |
| 2008/0246698 A1* | 10/2008 | Eom | ............. | G09G 3/3266 345/76 |
| 2019/0004643 A1* | 1/2019 | Ma | ............. | G09G 3/20 |

FOREIGN PATENT DOCUMENTS

| | | |
|---|---|---|
| CN | 1744182 A | 3/2006 |
| CN | 1794331 A | 6/2006 |
| CN | 103700333 A | 4/2014 |
| CN | 110909661 A | 3/2020 |

\* cited by examiner

Provide a trigger signal for the trigger signal line, provide a first clock signal for the first clock signal line, and provide a second clock signal is provided for the second clock signal line, so that a latch module in a first-stage shift register unit to an $N^{th}$-stage shift register unit outputs a lower-stage shift signal to an upper-stage shift signal input of a lower-stage shift register unit and outputs a lower-stage shift signal to the scan switch module and the light emission control switch module ⟶ S110

According to the lower-stage shift signal, output a scan signal transmitted by the scan signal input line through the scan signal output and output a light emission control signal transmitted by the light emission control signal input line through the light emission control signal output ⟶ S120

FIG. 14

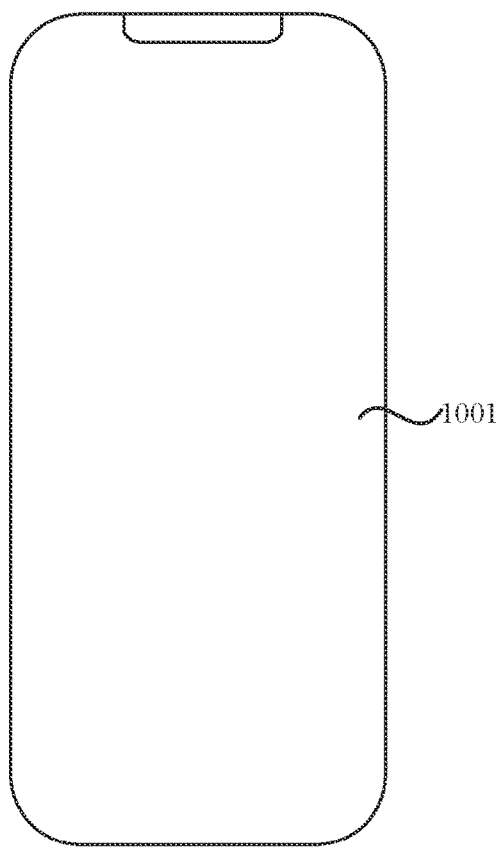

FIG. 15

SHIFT REGISTER, DISPLAY PANEL INCLUDING VOLTAGE RANGE ADJUSTMENT UNIT, DRIVING METHOD, AND DISPLAY DEVICE

CROSS-REFERENCE TO RELATED APPLICATION(S)

This application claims foreign priority benefits under U.S.C. § 119(a) or 35 U.S.C. § 365(b) to Chinese Patent Application No. 202011626722.X filed Dec. 31, 2020, the disclosure of which is incorporated herein by reference in its entirety.

TECHNICAL FIELD

Embodiments of the present disclosure relate to the field of display technologies and, in particular, to a shift register, a display panel, a driving method, and a display device.

BACKGROUND

The organic light-emitting diode (OLED) display has the advantages of self-lamination, low drive voltage, high luminous efficiency, short response time and flexible display realizability, and thus has become the most promising display.

The OLED element of the OLED display panel belongs to a current-driven element and thus needs to be provided with a corresponding pixel circuit and a drive circuit. The drive circuit provides a drive signal for the pixel circuit so that the pixel circuit provides a drive current for the OLED element to drive the OLED element to emit light. The pixel circuit of the OLED display usually includes a drive transistor, a light emission control transistor and a reset transistor. The drive circuit includes a light emission control drive circuit and a scan drive circuit. The light emission control drive circuit outputs a light emission control signal to control the light emission control transistor to be turned on or off, and the scan drive circuit outputs a scan signal to control the reset transistor to be turned on or off. That is, each signal (light emission control signal and scan signal) requires a separate group of drive circuits so that the drive circuit occupies a large area of the non-display area, which does not facilitate the narrow border design of the display.

SUMMARY

The embodiments of the present disclosure provide a shift register, a display panel, a driving method, and a display device to reduce the area of the non-display area where the shift register is located, thereby satisfying the demand of the narrow border of the display device.

In a first aspect, an embodiment of the present disclosure provides a shift register. The shift register includes multiple shift register units.

Each shift register unit includes a latch circuit, at least one scan switch circuit and at least one light emission control switch circuit.

Each shift register unit further includes a clock signal input terminal, an upper-stage shift signal input terminal, a lower-stage shift signal output terminal, a scan signal input terminal, a light emission control signal input terminal, a scan signal output terminal and a light emission control signal output terminal.

The latch circuit is electrically connected to the clock signal input terminal, the upper-stage shift signal input terminal and the lower-stage shift signal output terminal, respectively, and is configured to, in response to a clock signal inputted by the clock signal input terminal, latch an upper-stage shift signal inputted by the upper-stage shift signal input terminal and output the upper-stage shift signal through the lower-stage shift signal output terminal.

Each of the at least one scan switch circuit is electrically connected to the scan signal input terminal, the scan signal output terminal and the lower-stage shift signal output terminal, respectively, and is configured to, in response to a lower-stage shift signal outputted by the lower-stage shift signal output terminal, output a scan signal inputted by the scan signal input terminal through the scan signal output terminal.

Each of the at least one light emission control switch circuit is electrically connected to the light emission control signal input terminal, the light emission control signal output terminal and the lower-stage shift signal output terminal, respectively, and is configured to, in response to the lower-stage shift signal outputted by the lower-stage shift signal output terminal, output a light emission control signal inputted by the light emission control signal input terminal through the light emission control signal output terminal.

The clock signal input terminal includes a first clock signal input terminal and a second clock signal input terminal. A latch circuit in an odd number-stage shift register unit is electrically connected to the first clock signal input terminal, and a latch circuit in an even number-stage shift register unit is electrically connected to the second clock signal input terminal.

In a second aspect, an embodiment of the present disclosure further provides a display panel.

The display panel includes a trigger signal line, a first clock signal line, a second clock signal line, at least one scan signal input line, at least one light emission control signal input line, at least one scan line, at least one light emission control signal line and the shift register described in the first aspect.

An upper-stage shift signal input terminal of a first-stage shift register unit is electrically connected to the trigger signal line, and an upper-stage shift signal input terminal of a next-stage shift register unit is electrically connected to a lower-stage shift signal output terminal of a previous-stage shift register unit.

The first clock signal line is electrically connected to a first clock signal input terminal of an odd-number stage shift register unit, and the second clock signal line is electrically connected to a second clock signal input terminal of an even-number stage shift register unit.

The scan signal output terminal of each shift register unit is electrically connected to the at least one scan line.

A light emission control signal terminal of each shift register unit is electrically connected to the at least one light emission control signal line.

In a third aspect, an embodiment of the present disclosure further provides a driving method of a display panel. The driving method is applied to the display panel described in the second aspect.

The driving method of a display panel includes the steps described below.

A trigger signal is provided for the trigger signal line, a first clock signal is provided for the first clock signal line, and a second clock signal is provided for the second clock signal line, so that a latch circuit in a first-stage shift register unit to an $N^{th}$-stage shift register unit outputs a lower-stage shift signal to an upper-stage shift signal input terminal of a lower-stage shift register unit and outputs a lower-stage shift signal to the at least one scan switch circuit and the at least one light emission control switch circuit.

According to the lower-stage shift signal, a scan signal transmitted by the at least one scan signal input line is outputted through the scan signal output terminal and a light emission control signal transmitted by the at least one light emission control signal input line is outputted through the light emission control signal output terminal.

In a fourth aspect, an embodiment of the present disclosure further provides a display device including the display panel described in the second aspect.

In the embodiments of the present disclosure, the shift signal is transmitted by setting the latch circuit, and the shift signal may be used as the control signal of the scan switch circuit and the light emission control switch circuit. The scan switch circuit outputs the scan signal inputted by the scan signal input terminal through the scan signal output terminal according to the control signal, and the light emission control switch circuit outputs the light emission control signal inputted by the light emission control signal input terminal through the light emission control signal output terminal according to the control signal, that is, the switch circuit (scan switch circuit and light emission control switch circuit) is configured to control whether the signal required by the pixel circuit is transmitted to the pixel circuit. Compared with the related art, in the embodiments, the output of the scan signal and the light emission control signal can be completed by setting one shift register which is simple in structure and occupies a small area.

Even if the display modes of the display device are different, for example, the display mode is a normal mode, a rolling mode or a global mode, the structure of the display device can still be simple. In addition, the waveform of the scan signal outputted by the scan signal output terminal is the same as the waveform of the scan signal inputted by the scan signal input terminal, and the waveform of the light emission control signal outputted by the light emission control signal output terminal is the same as the waveform of the light emission control signal inputted by the light emission control signal input terminal, so that the inputted and outputted signals can be arbitrarily converted to each other without being controlled by the clock signal, that is, the operation is flexible and not affected by any additional signals.

BRIEF DESCRIPTION OF DRAWINGS

Other features, objects and advantages of the present disclosure will become more apparent after a detailed description of non-limiting embodiments with reference to the drawings below is read.

FIG. 14 is a flowchart of a driving method of a display panel according to an embodiment of the present disclosure; and FIG. 15 is a structural diagram of a display device according to an embodiment of the present disclosure.

DETAILED DESCRIPTION

Figure 1:
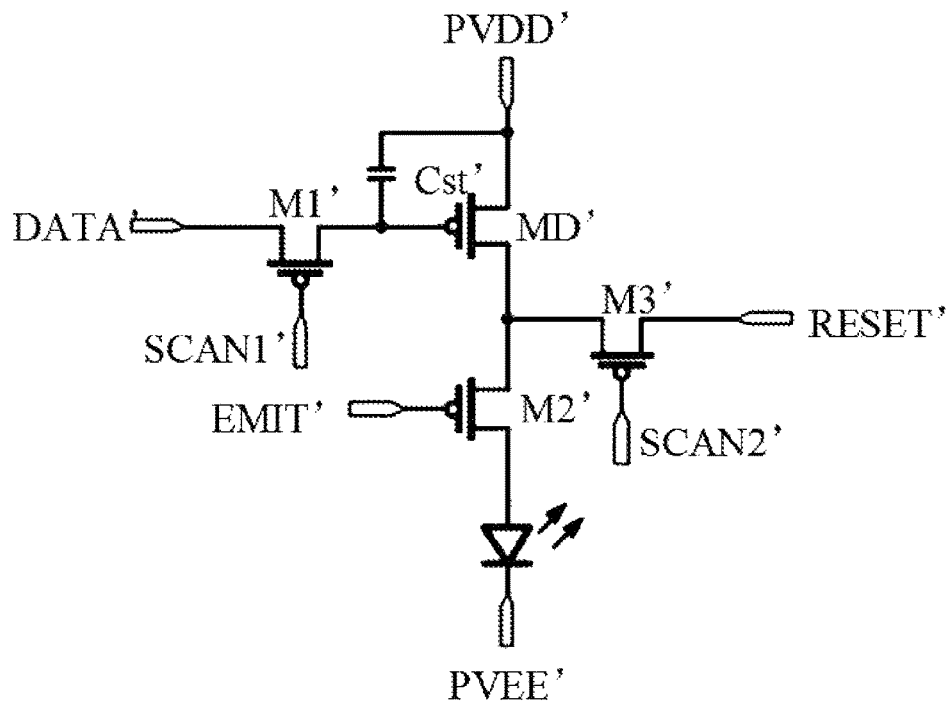
FIG. 1 is a structural diagram of a pixel circuit in the related art.

The present disclosure is described in more detail hereinafter with reference to the drawings and embodiments. It is to be understood that the embodiments described below are intended to explain and not to limit the present disclosure. In addition, it is to be noted that to facilitate description, only part, not all, of structures related to the present disclosure are illustrated in the drawings.

Figure 2:
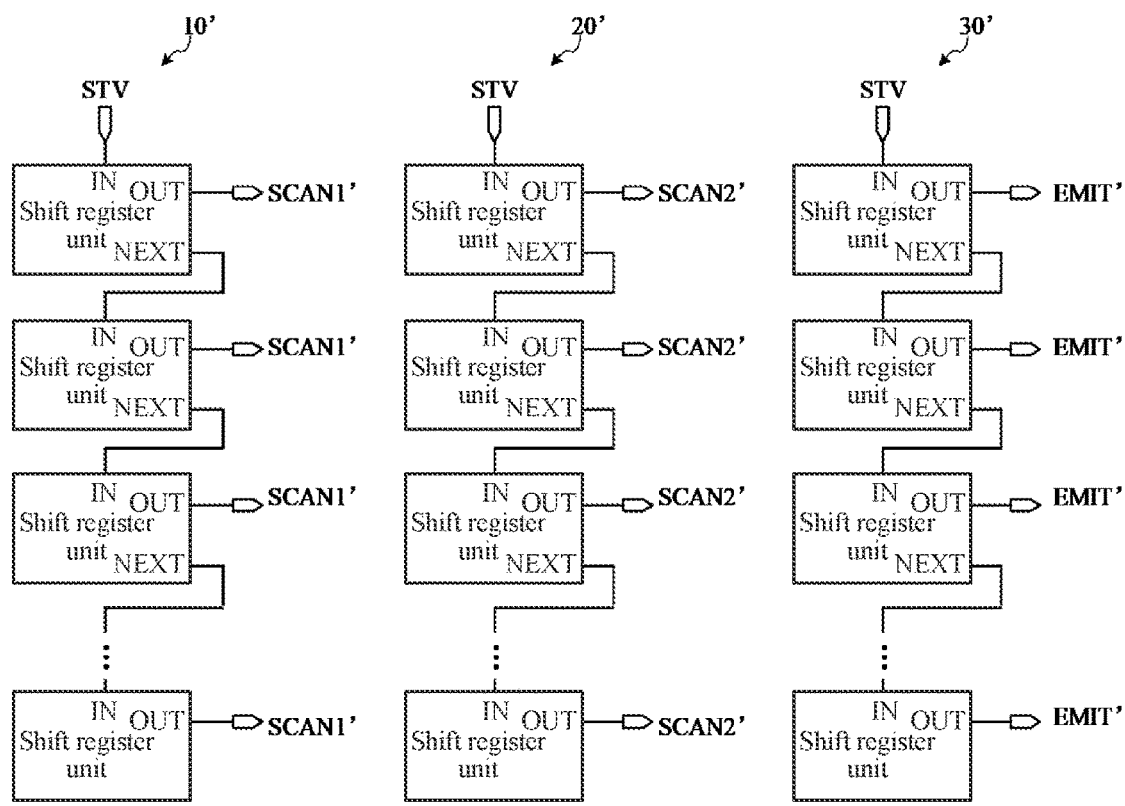
FIG. 2 is a structural diagram of a drive circuit in the related art.

FIG. 1 is a structural diagram of a pixel circuit in the related art. As shown in FIG. 1, the pixel circuit includes a data writing transistor M1', a light emission control transistor M2', a reset transistor M3', a drive transistor MD' and a storage capacitor Cst'. The gate of the data writing transistor M1' is electrically connected to a first scan signal terminal SCAN1', the gate of the light emission control transistor MT is electrically connected to the light emission control signal terminal EMIT', and the gate of the reset transistor M3' is electrically connected to a second scan signal terminal SCAN2'. The data writing transistor M1' is turned on or off according to the first scan signal inputted by the first scan signal terminal SCAN1', the light emission control transistor M2' is turned on or off according to the light emission control signal inputted by the light emission control signal terminal EMIT', and the reset transistor M3' is turned on or off according to the second scan signal inputted by the second scan signal terminal SCAN2'. The first scan signal, the second scan signal and the light emission control signal need to be provided with a corresponding drive circuit. As shown in FIG. 2, the first scan signal needs to be provided with the first scan drive circuit 10', the second scan signal needs to be provided with the second scan drive circuit 20' and the light emission control signal needs to be provided with the light emission control drive circuit 30'. Since each drive circuit is composed of multiple cascaded shift register units, the entire drive circuit 100' is bulky and inflexible and occupies a large area of the non-display area, which does not facilitate the narrow border design of the display.

In order to solve the above-mentioned problems, an embodiment of the present disclosure provides a shift register. The shift register includes multiple cascaded shift register units. Each shift register unit includes a latch circuit, at least one scan switch circuit and at least one light emission control switch circuit. Each shift register unit further includes a clock signal input terminal, an upper-stage shift signal input terminal, a lower-stage shift signal output terminal, a scan signal input terminal, a light emission control signal input terminal, a scan signal output terminal and a light emission control signal output terminal. The latch circuit is electrically connected to the clock signal input terminal, the upper-stage shift signal input terminal and the lower-stage shift signal output terminal, separately, and is configured to, in response to a clock signal inputted by the clock signal input terminal, latch an upper-stage shift signal inputted by the upper-stage shift signal input terminal and output the upper-stage shift signal through the lower-stage shift signal output terminal. Each of the at least one scan switch circuit is electrically connected to the scan signal input terminal, the scan signal output terminal and the lower-stage shift signal output terminal, separately, and is configured to, in response to a lower-stage shift signal outputted by the lower-stage shift signal output terminal, output a scan signal inputted by the scan signal input terminal through the scan signal output terminal. Each of the at least one light emission control switch circuit is electrically connected to the light emission control signal input terminal, the light emission control signal output terminal and the lower-stage shift signal output terminal, separately, and is configured to, in response to the lower-stage shift signal outputted by the lower-stage shift signal output terminal, output a light emission control signal inputted by the light emission control signal input terminal through the light emission control signal output terminal. The clock signal input terminal includes a first clock signal input terminal and a second clock signal input terminal. A latch circuit in an odd number-stage shift register unit is electrically connected to the first clock signal input terminal, and a latch circuit in an even number-stage shift register unit is electrically connected to the second clock signal input terminal.

In the above-mentioned technical solution, the output terminal of the scan signal and the light emission control signal can be completed by setting one shift register which is simple in structure and occupies a small area. Even if the display modes of the display device are different, for example, the display mode is a normal mode, a rolling mode or a global mode, the structure of the display device can still be simple. In addition, the waveform of the scan signal outputted by the scan signal output terminal is the same as the waveform of the scan signal inputted by the scan signal input terminal, and the waveform of the light emission control signal outputted by the light emission control signal output terminal is the same as the waveform of the light emission control signal inputted by the light emission control signal input terminal, so that the inputted and outputted signals can be arbitrarily converted to each other without being controlled by the clock signal, that is, the operation is flexible and not affected by any additional signals.

The above is the core idea of the present invention. Based on the embodiments described herein, all other embodiments obtained by those of ordinary skill in the art without doing creative work are within the scope of the present disclosure. Technical solutions in embodiments of the present disclosure are described clearly and completely below in conjunction with the drawings in the embodiments of the present disclosure.

Figure 3:
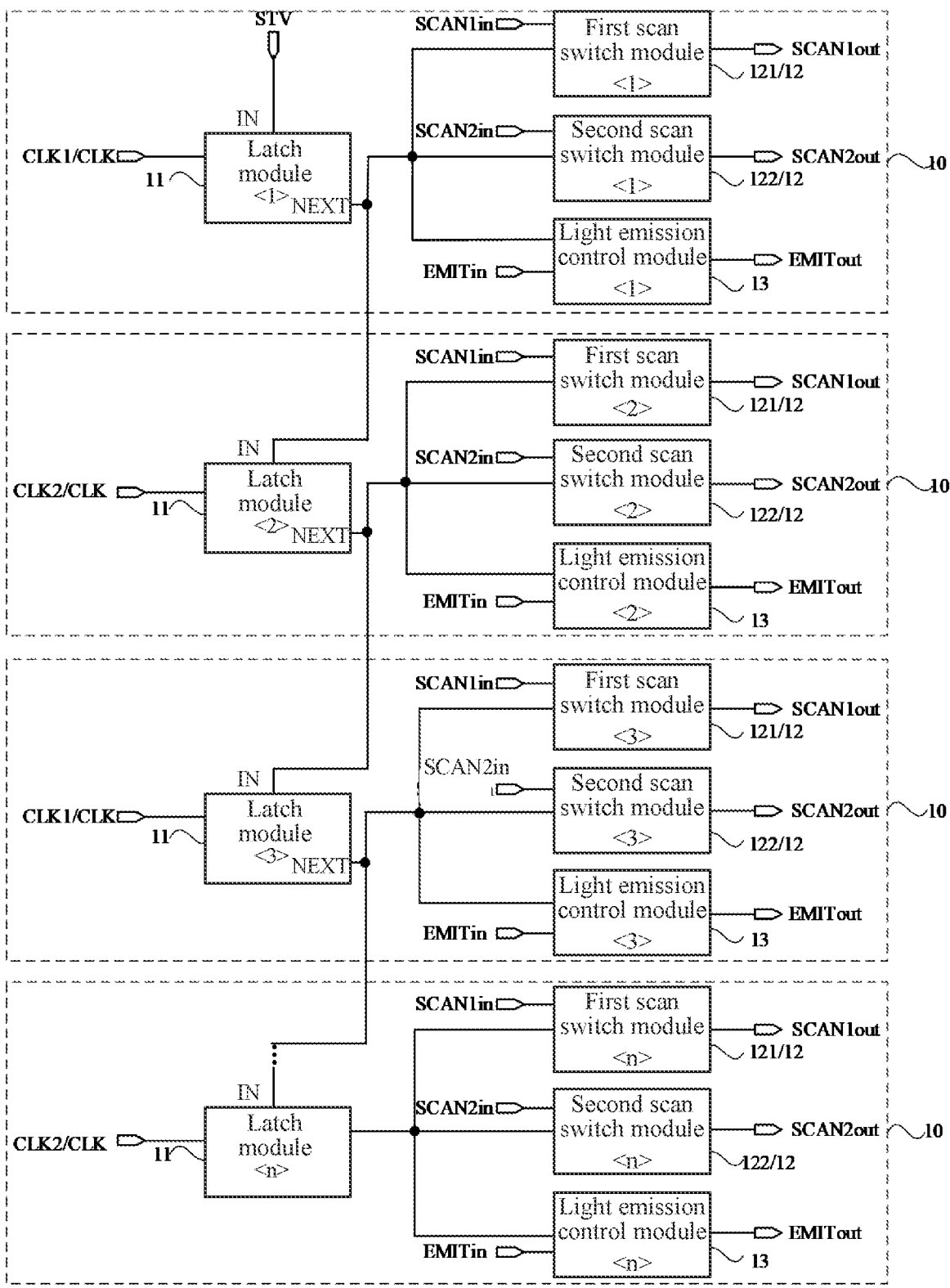
FIG. 3 is a structural diagram of a shift register according to an embodiment of the present disclosure.

FIG. 3 is a structural diagram of a shift register according to an embodiment of the present disclosure. As shown in FIG. 3, the shift register 100 provided by the embodiment of the present disclosure includes multiple shift register units 10 that are cascaded. For example, the shift register 100 may include n shift register units 10, and these n shift register units 10 are set in a cascaded manner, where n is a positive integer. Each shift register unit 10 includes a latch circuit 11, at least one scan switch circuit 12 and at least one light emission control switch circuit 13. In FIG. 3, the shift register is illustrated by using an example in which each shift register unit 10 includes two scan switch circuits 12 and one light emission control switch circuit 13. The two scan switch circuits 12 include a first scan switch circuit 121 and a second scan switch circuit 122.

Each shift register unit 10 further includes a clock signal input terminal CLK, an upper-stage shift signal input terminal IN, a lower-stage shift signal output terminal NEXT, a scan signal input terminal SCANin, a light emission control signal input terminal EMITin, a scan signal output terminal SCANout and a light emission control signal output terminal EMITout. The clock signal input terminal CLK includes a first clock signal input terminal CLK1 and a second clock signal input terminal CLK2. Accordingly, when the two scan switch circuits 12 include the first scan switch circuit 121 and the second scan switch circuit 122, the scan signal output terminal SCANout includes a first scan signal output terminal SCAN1out and a second scan signal output terminal SCAN2out. The scan signal input terminal SCANin includes a first scan signal input terminal SCAN1in and a second scan signal input terminal SCAN2in.

The latch circuit 11 is electrically connected to the clock signal input terminal CLK, the upper-stage shift signal input terminal IN and the lower-stage shift signal output terminal NEXT, separately. The latch circuit 11 in an odd number-stage shift register unit 10 is electrically connected to the first clock signal input terminal CLK1, and the latch circuit 11 in an even number-stage shift register unit 10 is electrically connected to the second clock signal input terminal CLK2. The latch circuit 11 is configured to, in response to a clock signal inputted by the clock signal input terminal CLK, latch an upper-stage shift signal inputted by the upper-stage shift signal input terminal IN and output the upper-stage shift signal through the lower-stage shift signal output terminal NEXT.

For example, when the shift register unit 10 is a first-stage shift register unit, the latch circuit 11 of the shift register unit 10 latches a starting signal STV in response to a clock signal inputted by the clock signal input terminal CLK1 and outputs the starting signal STV through the lower-stage shift signal output terminal NEXT. Accordingly, when the shift register unit is a second-stage shift register unit 10, the latch circuit 11 of the second-stage shift register unit 10 latches a lower-stage shift signal outputted by the latch circuit 11 of the first-stage shift register unit in response to a clock signal inputted by the clock signal input terminal CLK2 and outputs the lower-stage shift signal through the lower-stage shift signal output terminal NEXT of the latch circuit 11 of the second-stage shift register unit 10. When the shift register unit 10 is a third-stage shift register unit 10, the latch circuit 11 of the third-stage shift register unit 10 latches the lower-stage shift signal outputted by the latch circuit 11 of the second-stage shift register unit 10 in response to a clock signal inputted by the clock signal input terminal CLK1 and outputs the lower-stage shift signal through the lower-stage shift signal output terminal NEXT of the latch circuit 11 of the third-stage shift register unit 10. The rest of the shift register units operate in a similar manner.

The first scan switch circuit 121 is electrically connected to the first scan signal input terminal SCAN1in, the first scan signal output terminal SCAN1out and the lower-stage shift signal output terminal NEXT, separately, and is configured to, in response to a lower-stage shift signal outputted by the lower-stage shift signal output terminal NEXT, output a scan signal inputted by the first scan signal input terminal SCAN1in through the first scan signal output terminal SCAN1out. That is, the latch circuit 11 latches the transferred shift signal and outputs the shift signal through the lower-stage shift signal output terminal NEXT.

The shift signal also functions as a control signal of the first scan switch circuit 121 and controls the first scan switch circuit 121 to be turned on to output the first scan signal required by the pixel circuit and inputted by the first scan signal input terminal SCAN1in to the pixel circuit through the first scan signal output terminal SCAN1out.

For example, when the pixel circuit is the pixel circuit as shown in FIG. 1, the shift signal can control the data writing transistor M1' to be turned on or off so as to complete the writing of the data signal.

The second scan switch circuit 122 is electrically connected to the second scan signal input terminal SCAN2in, the second scan signal output terminal SCAN2out and the lower-stage shift signal output terminal NEXT, separately, and is configured to, in response to the lower-stage shift signal outputted by the lower-stage shift signal output terminal NEXT, output a scan signal inputted by the second scan signal input terminal SCAN2in through the second scan signal output terminal SCAN2out. That is, the latch circuit 11 latches the transferred shift signal and outputs the shift signal through the lower-stage shift signal output terminal NEXT. The shift signal also functions as a control signal of the second scan switch circuit 122 and controls the second scan switch circuit 122 to be turned on to output the second scan signal required by the pixel circuit and inputted by the second scan signal input terminal SCAN2in to the pixel circuit through the second scan signal output terminal SCAN2out. For example, when the pixel circuit is the pixel circuit as shown in FIG. 1, the shift signal can control the reset transistor M3' to be turned on or off so as to complete the reset of the anode of a light emission element.

The light emission control switch circuit 13 is electrically connected to the light emission control signal input terminal EMITin, the light emission control signal output terminal EMITout and the lower-stage shift signal output terminal NEXT, separately, and is configured to, in response to the lower-stage shift signal outputted by the lower-stage shift signal output terminal NEXT, output a light emission control signal inputted by the light emission control signal input terminal EMITin through the light emission control signal output terminal EMITout. That is, the shift signal also functions as a control signal of the light emission control switch circuit 13 and controls the light emission control switch circuit 13 to be turned on to output the required light emission control signal inputted by the light emission control signal input terminal EMITin to the pixel circuit through the light emission control signal output terminal EMITout. For example, when the pixel circuit is the pixel circuit as shown in FIG. 1, the shift signal can control the light emission control transistor MT to be turned on or off so as to enable the drive current to flow into the anode of the light emission element so that the light emission element emits light in response to the drive current.

In the embodiment of the present disclosure, the shift signal is transferred by setting the latch circuit 11, and the shift signal may be used as the control signal of the scan switch circuit 12 and the light emission control switch circuit 13. The scan switch circuit 12 outputs the scan signal inputted by the scan signal input terminal SCANin through the scan signal output terminal SCANout according to the control signal, and the light emission control switch circuit 13 outputs the light emission control signal inputted by the light emission control signal input terminal EMITin through the light emission control signal output terminal EMITout according to the control signal, that is, the switch circuit is configured to control whether the signal required by the pixel circuit is transmitted to the pixel circuit. Compared with the related art, in the embodiment, the output of the scan signal and the light emission control signal can be completed by setting one shift register which is simple in structure and occupies a small area. Even if the display modes of the display device are different, for example, the display mode is a normal mode, a rolling mode or a global mode, the structure of the display device can still be simple. In addition, the waveform of the scan signal outputted by the scan signal output terminal SCANout is the same as the waveform of the scan signal inputted by the scan signal input terminal SCANin, and the waveform of the light emission control signal outputted by the light emission control signal output terminal EMITout is the same as the waveform of the light emission control signal inputted by the light emission control signal input terminal EMITin, so that the inputted and outputted signals can be arbitrarily converted to each other without being controlled by the clock signal, that is, the operation is flexible and not affected by any additional signals.

It is to be noted that the shift register in the embodiment is set for the pixel circuit shown in FIG. 1, that is, two scan signals and one light emission control signal are output. However, when the pixel circuit changes, the number of the scan switch circuits, as well as the number of light emission control switch circuits, can be set according to the pixel circuit to complete the output of the scan signal and the light emission control signal.

Figure 4:
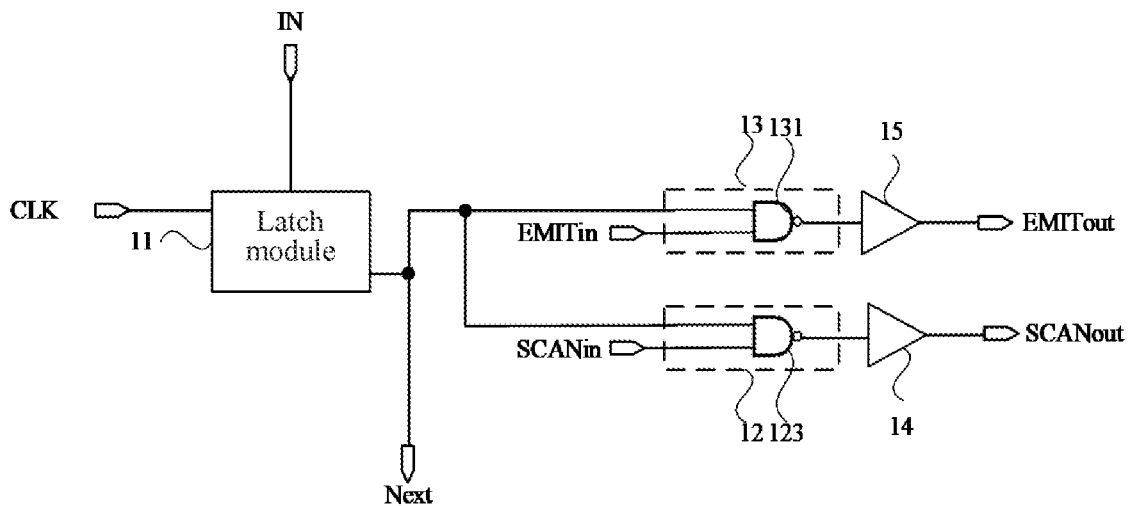
FIG. 4 is a structural diagram of a shift register unit according to an embodiment of the present disclosure.

Optionally, FIG. 4 is a structural diagram of a shift register unit according to an embodiment of the present disclosure. As shown in FIG. 4, the scan switch circuit 12 includes a first NAND gate 123. A first input terminal of the first NAND gate 123 is electrically connected to the lower-stage shift signal output terminal NEXT, a second input terminal of the first NAND gate 123 is electrically connected to the scan signal input terminal SCANin, and an output terminal of the first NAND gate 123 is electrically connected to the scan signal output terminal SCANout.

For example, the signal outputted by the lower-stage shift signal output terminal NEXT is a high level, that is, the signal inputted by the first input terminal of the first NAND gate 123 is a high level. At this point, the first NAND gate 123 can realize that the signal outputted by the output terminal of the first NAND gate 123 is controlled by the scan signal inputted by the scan signal input terminal SCANin when the lower-stage shift signal output terminal NEXT is a high level. That is, when the scan signal inputted by the second input terminal of the first NAND gate 123 is a high level, the signal outputted by the output terminal of the first NAND gate 123 is a signal opposite to the scan signal (that is, this signal is a low level); when the scan signal inputted by the second input terminal of the first NAND gate 123 is a low level, the signal outputted by the output terminal of the first NAND gate 123 is a signal opposite to the scan signal (that is, this signal is a high level). Based on this, the level of the signal outputted by the scan signal output terminal SCANout is opposite to the level of the scan signal inputted by the scan signal input terminal SCANin.

Optionally, with continued reference to FIG. 4, each shift register unit 10 further includes a first buffer 14. The first buffer 14 includes an even number of inverters or an odd number of inverters (not shown in FIG. 4). The number of inverters is set according to the output of the scan signal. If the signal outputted by the scan switch circuit 12 is a low level, for example, when the scan switch circuit 12 includes a first NAND gate 123, the signal outputted by the output terminal of the first NAND gate 123 is a low level. For example, the first buffer 14 including an odd number of inverters can be set so that the level of the scan signal outputted by the scan signal output terminal SCANout is the same as the level of the scan signal inputted by the scan signal input terminal SCANin, which, meanwhile, can increase the drive capability of the scan signal.

Optionally, with continued reference to FIG. 4, the light emission control switch circuit 13 includes a fourth NAND gate 131. A first input terminal of the fourth NAND gate 131 is electrically connected to the lower-stage shift signal output terminal NEXT, a second input terminal of the fourth NAND gate 131 is electrically connected to the light emission control signal input terminal EMITin, and an output terminal of the fourth NAND gate 131 is electrically connected to the light emission control signal output terminal EMITout.

For example, the signal outputted by the lower-stage shift signal output terminal NEXT is a high level, that is, the signal inputted by the first input terminal of the fourth NAND gate 131 is a high level. At this point, the fourth NAND gate 131 can realize that the signal outputted by the output terminal of the fourth NAND gate 131 is controlled by the light emission control signal inputted by the light emission control signal input terminal EMITin when the signal outputted by the lower-stage shift signal output terminal NEXT is a high level. That is, when the scan signal inputted by the second input terminal of the fourth NAND gate 131 is a high level, the signal outputted by the output terminal of the fourth NAND gate 131 is a signal opposite to the light emission control signal (that is, this signal is a low level); when the scan signal inputted by the second input terminal of the fourth NAND gate 131 is a low level, the signal outputted by the output terminal of the fourth NAND gate 131 is a signal opposite to the light emission control signal (that is, this signal is a high level). Based on this, the level of the signal outputted by the light emission control signal output terminal EMITout is opposite to the level of the light emission control signal inputted by the light emission control signal input terminal EMITin.

Optionally, with continued reference to FIG. 4, each shift register unit 10 further includes a second buffer 15. The second buffer 15 includes an even number of inverters or an odd number of inverters (not shown in FIG. 4). The number of inverters is set according to the output of the light emission control signal. If the signal outputted by the light emission control switch circuit 13 is a low level, for example, when the light emission control switch circuit 13 includes a third NAND gate 131, the signal outputted by the output terminal of the third NAND gate 131 is a low level. For example, the second buffer 15 including an odd number of inverters can be set so that the level of the light emission control signal outputted by the light emission control signal output terminal EMITout is the same as the level of the light emission control signal inputted by the light emission control signal input terminal EMITin, which, meanwhile, can increase the drive capability of the light emission control signal.

It is to be noted that the scan switch circuit 12 and the light emission control switch circuit 13 include, but are not limited to, the NAND gates, which can be set by those skilled in the art according to the actual situation as long as the scan signal inputted by the scan signal input terminal can be outputted after the corresponding logic operation is completed. In other embodiments, there may also be a combination of a NOR gate and/or a NOT gate.

Figure 5:
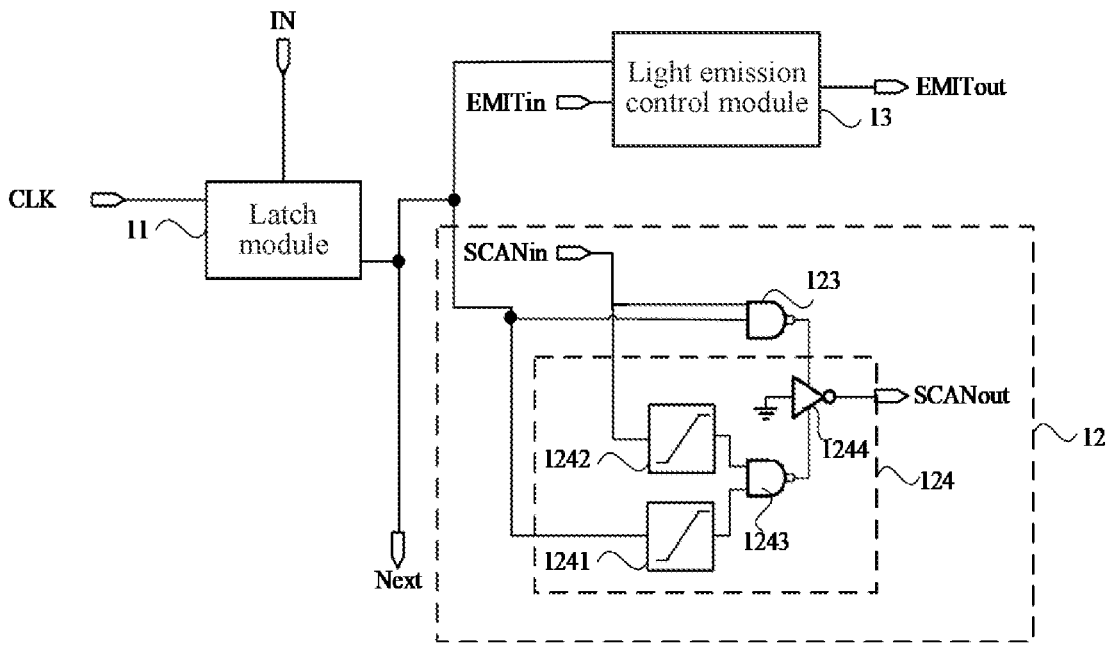
FIG. 5 is a structural diagram of another shift register unit according to an embodiment of the present disclosure.

Optionally, FIG. 5 is a structural diagram of another shift register unit according to an embodiment of the present disclosure. As shown in FIG. 5, the scan switch circuit 12 further includes a first voltage range adjustment unit 124. A first input terminal of the first voltage range adjustment unit 124 is electrically connected to the lower-stage shift signal output terminal NEXT, a second input terminal of the first voltage range adjustment unit 124 is electrically connected to the scan signal input terminal SCANin, and the output terminal of the first NAND gate 123 is electrically connected to a third input terminal of the first voltage range adjustment unit 124. The first voltage range adjusting unit 124 is configured to, in response to the lower-stage shift signal outputted by the lower-stage shift signal output terminal NEXT and the scan signal inputted by the scan signal input terminal SCANin, adjust a potential outputted by the first NAND gate 123 from being switched between a first potential V1 and a second potential V2 to being switched between a third potential V3 and a fourth potential V4, where |V2−V1|<|V4−V3|.

For example, the device in the scan switch circuit 12 is an 8V device, that is, the withstand voltage range of the device is 8V. The voltage range of the signal inputted by the scan signal input terminal SCANin is, for example, from 0V to 5V. A first potential inputted by the scan signal input terminal SCANin is 0V and a second potential is 5V. That is, when the signal inputted by the scan signal input terminal SCANin is a low level, the potential is 0V; when the signal inputted by the scan signal input terminal SCANin is a high level, the potential is 5V. After the adjustment of the first voltage range adjustment unit 124, a third potential outputted by the first voltage range adjustment unit 124 is −5V and a fourth potential is 5V. That is, when the signal outputted by the first voltage range adjustment unit 124 is a low level, the potential is −5V; when the signal outputted by the first voltage range adjustment unit 124 is a high level, the potential is 5V. The first voltage range adjustment unit 124 adjusts the voltage range of the scan signal outputted by the scan signal output terminal SCANout from the range of 0 to 5V to the range of −5V to 5V. That is, the voltage range of the scan signal outputted by the scan signal output terminal SCANout is expanded in a case where the potential range of the inputted signal remains unchanged. In this manner, such a setting facilitates the reset of the pixel circuit by using a low potential and improves the display effect, and the constant voltage range of the inputted signal facilitates the maintenance of a low circuit power consumption.

Optionally, with continued reference to FIG. 5, the first voltage range adjusting unit 124 includes a first level converter 1241, a second level converter 1242, a second NAND gate 1243 and a first inverter 1244. An input terminal of the first level converter 1241 is electrically connected to the lower-stage shift signal output terminal NEXT, and an output terminal of the first level converter 1241 is electrically connected to a first input terminal of the second NAND gate 1243. An input terminal of the second level converter 1242 is electrically connected to the scan signal input terminal SCANin, and an output terminal of the second level converter 1242 is electrically connected to a second input terminal of the second NAND gate 1243. The output terminal of the first NAND gate 123 is electrically connected to a first power input terminal of the first inverter 1244. An output terminal of the second NAND gate 1243 is electrically connected to a second power input terminal of the first inverter 1244. An input terminal of the first inverter 1244 is grounded, and an output terminal of the first inverter 1244 is electrically connected to the scan signal output terminal SCANout.

For example, the signal outputted by the lower-stage shift signal output terminal NEXT is in a range from 0V to 5V, and the voltage outputted by the first level converter 1241 is in a range from −5V to 0V. The signal inputted by the scan signal input terminal SCANin is in a range from 0V to 5V, and the voltage outputted by the second level converter 1242 is in a range from −5V to 0V. When the voltage of the signal outputted by the output terminal of the first NAND gate 123 is 5V, at this point, the voltage of the signal outputted by the first level converter 1241 is −5V, the voltage of the signal outputted by the second level converter 1242 is 0V, and the second NAND gate 1243 outputs 0V. That is, the voltage inputted by the first power input terminal of the first inverter 1244 is 5V, and the voltage inputted by the second power input terminal of the first inverter 1244 is 0V. At this point, the signal outputted by the output terminal of the first inverter 1244 is 5V. When the voltage inputted by the first power input terminal of the first inverter 1244 is 0V, and the voltage inputted by the second power input terminal of the first inverter 1244 is −5V. At this point, the signal outputted by the output terminal of the first inverter 1244 is −5V. In this manner, the voltage outputted by the scan signal output terminal SCANout is in a range from −5V to 5V.

Figure 6:
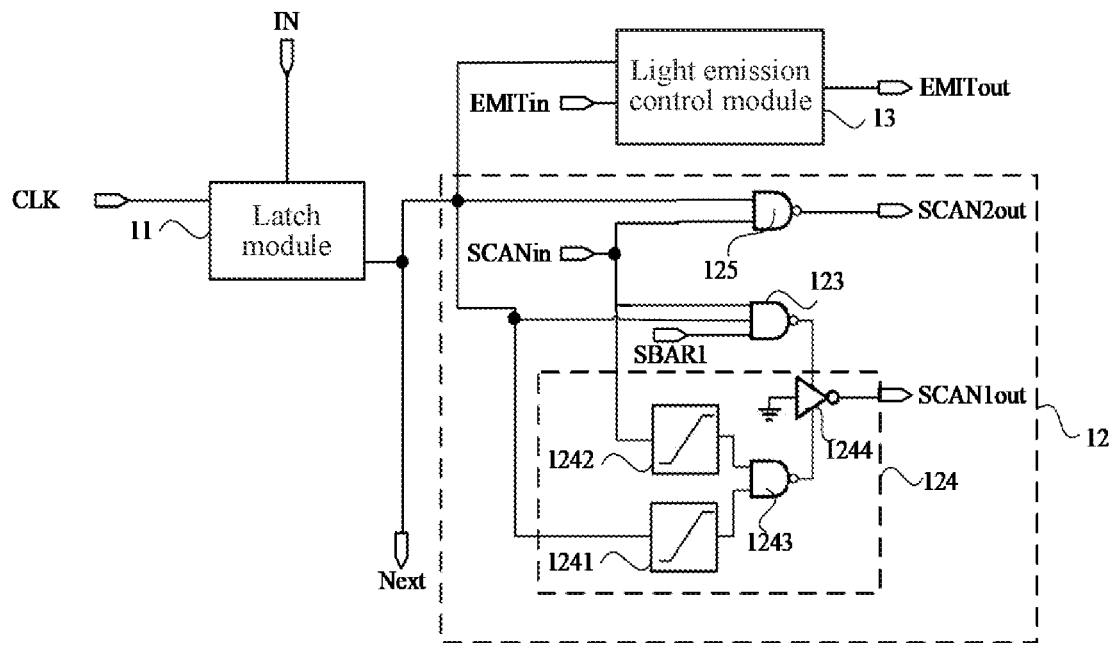
FIG. 6 is a structural diagram of another shift register unit according to an embodiment of the present disclosure.

Optionally, FIG. 6 is a structural diagram of another shift register unit according to an embodiment of the present disclosure. As shown in FIG. 6, the scan switch circuit 10 includes a third NAND gate 125. A first input terminal of the third NAND gate 125 and the first input terminal of the first NAND gate 123 are electrically connected to the lower-stage shift signal output terminal NEXT, and a second input terminal of the third NAND gate 125 and the second input terminal of the first NAND gate 123 are electrically connected to the same scan signal input terminal SCANin. Different scan signal output terminals SCANout may include, for example, a first scan signal output terminal SCAN1out and a second scan signal output terminal SCAN2out. The output terminal of the third NAND gate 125 is electrically connected to the second scan signal output terminal SCAN2out, and the output terminal of the first inverter 1244 is electrically connected to the first scan signal output terminal SCAN1out. That is, although the first NAND gate 123 and the third NAND gate 125 are connected to the same scan signal input terminal SCANin, different scan signals can be outputted through the first scan signal output terminal SCAN1out and the second scan signal output terminal SCAN2out, respectively.

Figure 7:
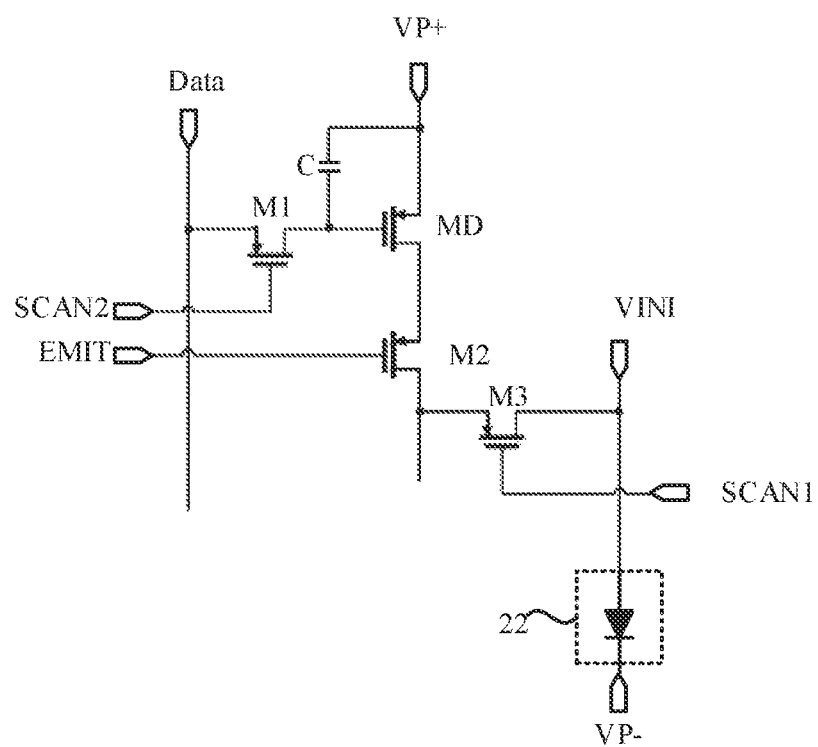
FIG. 7 is a structure diagram of a pixel circuit according to an embodiment of the present disclosure.

For example, FIG. 7 is a structure diagram of a pixel circuit according to an embodiment of the present disclosure. As shown in FIGS. 6 and 7, the pixel circuit includes a drive transistor MD, a data writing transistor M1, a light emission control transistor M2, an initialization transistor M3 and a storage capacitor C. The gate of the data writing transistor M1 is electrically connected to the second scan signal terminal SCAN2, and the second scan signal terminal SCAN2 receives the scan signal outputted by the second scan signal output terminal SCAN2out. The gate of the initialization transistor M3 is electrically connected to the first scan signal terminal SCAN1, and the first scan signal terminal SCAN1 receives the scan signal outputted by the first scan signal output terminal SCAN1out. The gate of the light emission control transistor M2 is electrically connected to the light emission control terminal EMIT, and the light emission control terminal EMIT receives the light emission control signal outputted by the light emission control signal output terminal EMITout. In the data writing stage, for example, the data writing transistor M1 can be controlled to be turned on by using the scan signal outputted by the second scan signal output terminal SCAN2out, and the initialization transistor M3 is controlled to be turned on by using the scan signal outputted by the first scan signal output terminal SCAN1out (this scan signal has the same waveform as the scan signal outputted by the second scan signal output terminal SCAN2out but has a wider voltage range than the scan signal outputted by the second scan signal output terminal SCAN2out), so that a very low potential is written to the anode of the light emission element 22 through the initialization transistor M3 to reset the anode of the light emission element 22. In the light emission stage, the light emission control signal inputted by the light emission control terminal EMIT controls the light emission control transistor M2 to be turned on, the drive current generated by the drive transistor MD flows into the light emission element 22, and the light emission element 22 emits light in response to the drive current.

The technical solution of the embodiment can achieve that the inputted scan signals are the same scan signals but two scan signals with the same waveform and different voltage ranges can be outputted so as to satisfy different demands. Two scan signals can be outputted through one scan signal input terminal SCANin, thereby reducing the number of signal lines, reducing the number of control terminals on the chip used for driving the shift register, and saving the chip costs.

Optionally, with continued reference to FIG. 6, the shift register unit 10 further includes a first cutoff signal input terminal SBAR1. The first cutoff signal input terminal SBAR1 is electrically connected to a third input terminal of the first NAND gate 123. For example, the signal inputted by the first cutoff signal input terminal SBAR1 is 0. The scan signal outputted by the first scan signal output terminal SCAN1out is a high level all the time. If the pixel circuit is the pixel circuit shown in FIG. 7, the initialization transistor M3 is always on an off-state, and when the light emission control signal outputted by the light emission control signal output terminal EMITout is a high level all the time, the display device can switch from the 4T1C mode to the 2T1C mode.

In the above-mentioned embodiments, the scan switch circuit 12 includes a first voltage range adjustment unit 124 to expand the voltage range of the scan signal outputted by the scan signal output terminal SCANout, and the light emission control switch circuit 13 can also be set in the same way to satisfy the demand of the low circuit power consumption.

Figure 8:
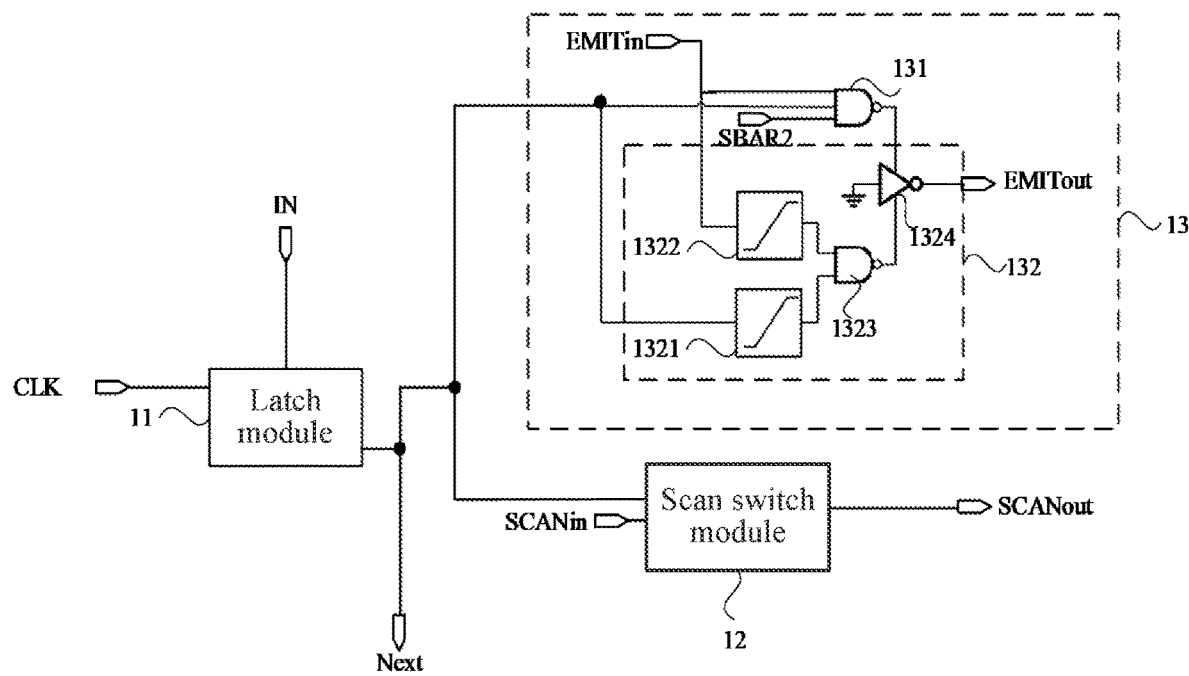
FIG. 8 is a structural diagram of another shift register unit according to an embodiment of the present disclosure.

Optionally, FIG. 8 is a structural diagram of another shift register unit according to an embodiment of the present disclosure. As shown in FIG. 8, the light emission control switch circuit 13 further includes a second voltage range adjustment unit 132. A first input terminal of the second voltage range adjustment unit 132 is electrically connected to the lower-stage shift signal output terminal NEXT, a second input terminal of the second voltage range adjustment unit 132 is electrically connected to the light emission control signal input terminal EMITin, and the output terminal of the third NAND gate is electrically connected to a third input terminal of the second voltage range adjustment unit 132. The second voltage range adjusting unit 132 is configured to, in response to the lower-stage shift signal outputted by the lower-stage shift signal output terminal NEXT and the light emission control signal inputted by the light emission control signal input terminal EMITin, adjust a potential outputted by the third NAND gate 131 from being switched between a fifth potential V5 and a sixth potential V6 to being switched between a seventh potential V7 and an eighth potential V8, where |V6−V7|<|V8−V7|.

For example, the device in the light emission control switch circuit 13 is an 8V device, that is, the withstand voltage range of the device is 8V. The voltage of the signal inputted by the light emission control signal input terminal EMITin ranges, for example, from 0V to 5V. A first potential inputted by the light emission control signal input terminal EMITin is 0V and a second potential is 5V. That is, when the signal inputted by the light emission control signal input terminal EMITin is a low level, the potential is 0V; when the signal inputted by the light emission control signal input terminal EMITin is a high level, the potential is 5V. Through the adjustment of the second voltage range adjustment unit 132, a third potential outputted by the second voltage range adjustment unit 132 is −5V and a fourth potential is 5V. That is, when the signal outputted by the second voltage range adjustment unit 132 is a low level, the potential is −5V; when the signal outputted by the second voltage range adjustment unit 132 is a high level, the potential is 5V. The second voltage range adjustment unit 132 adjusts the voltage range of the light emission control signal outputted by the light emission control signal output terminal EMITout from a range of 0V to 5V to a range of −5V to 5V.

That is, the voltage range of the light emission control signal outputted by the light emission control signal output terminal EMITout is expanded in a case where the potential range of the inputted signal remains unchanged. In this manner, the constant voltage range of the inputted signal facilitates the maintenance of the low circuit power consumption.

Optionally, with continued reference to FIG. 8, the second voltage range adjusting unit 132 includes a third level converter 1321, a fourth level converter 1322, a fifth NAND gate 1323 and a second inverter 1324. An input terminal of the third level converter 1321 is electrically connected to the lower-stage shift signal output terminal NEXT, and an output terminal of the third level converter 1321 is electrically connected to a first input terminal of the fifth NAND gate 1323. An input terminal of the fourth level converter 1322 is electrically connected to the light emission control signal input terminal EMITin, and an output terminal of the fourth level converter 1322 is electrically connected to a second input terminal of the fifth NAND gate 1323. The output terminal of the fourth NAND gate 131 is electrically connected to a first power input terminal of the second inverter 1324. An output terminal of the fifth NAND gate 131 is electrically connected to a second power input terminal of the second inverter 1324, a control terminal of the second inverter 1324 is grounded, and an output terminal of the second inverter 1324 is electrically connected to the light emission control signal output terminal EMITout.

For example, the voltage of the signal outputted by the lower-stage shift signal output terminal NEXT ranges from 0V to 5V, and the voltage outputted by the third level converter 1321 ranges from −5V to 0V. The voltage of the signal inputted by the light emission control signal input terminal EMITin ranges from 0V to 5V, and the voltage outputted by the fourth level converter 1322 ranges from −5V to 0V. When the voltage of the signal outputted by the output of the fourth NAND gate 131 is 5V, at this point, the voltage of the signal outputted by the third level converter 1321 is −5V, the voltage of the signal outputted by the fourth level converter 1322 is 0V, and the fifth NAND gate 1323 outputs 0V. That is, the voltage inputted by the first power input of the second inverter 1324 is 5V, and the voltage inputted by the second power input terminal of the second inverter 1324 is 0V. At this point, the signal outputted by the output terminal of the second inverter 1324 is 5V. When the voltage inputted by the first power input terminal of the second inverter 1324 is 0V, and the voltage inputted by the second power input terminal of the second inverter 1324 is −5V. At this point, the signal outputted by the output terminal of the second inverter 1324 is −5V. In this manner, the voltage outputted by the light emission control signal output terminal EMITout ranges from −5V to 5V.

Optionally, with continued reference to FIG. 8, the shift register unit 10 further includes a second cutoff signal input terminal SBAR2. The second cutoff signal input terminal SBAR2 is electrically connected to a third input terminal of the fourth NAND gate 131. For example, the signal inputted by the second cutoff signal input terminal SBAR2 is 0. The light emission control signal outputted by the light emission control signal output terminal EMITout is a high level all the time, and the scan signal outputted by the light emission control signal output terminal EMITout is a high level all the time. If the pixel circuit is the pixel circuit as shown in FIG. 7, the initialization transistor M3 and the light emission control transistor M2 are always on an off-state so that the display device can switch from the 4T1C mode to the 2T1C mode.

Figure 9:
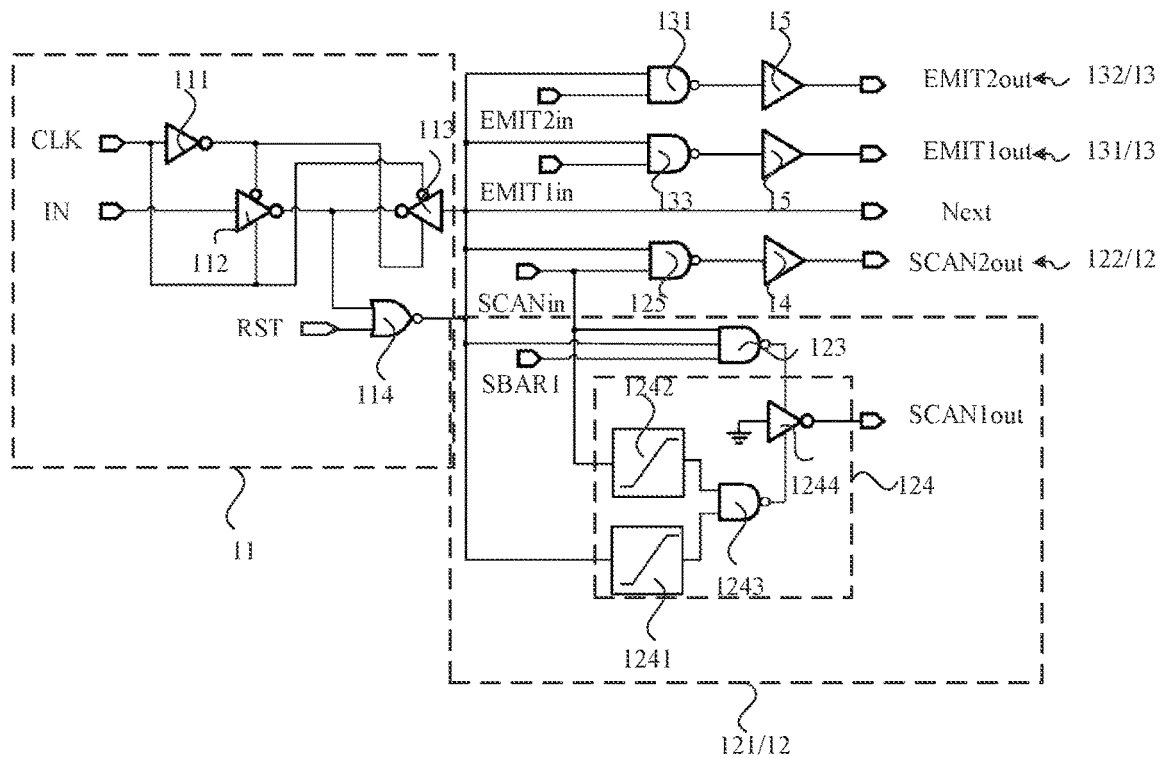
FIG. 9 is a structural diagram of another shift register unit according to an embodiment of the present disclosure.

36—On the basis of the above-mentioned embodiments, optionally, FIG. 9 is a structural diagram of another shift register unit according to an embodiment of the present disclosure. As shown in FIG. 9, the latch circuit 11 includes a third inverter 111, a first tri-state gate 112, a second tri-state gate 113 and a NOR gate 114. The shift register unit 10 further includes a reset terminal RST, and the reset terminal RST is configured to transmit a reset signal. An input terminal of the third inverter 111, a first power input terminal of the second tri-state gate 113 and a second power input terminal of the first tri-state gate 112 are electrically connected to the clock signal input terminal CLK, respectively, and an output terminal of the third inverter 111 is electrically connected to a first power input terminal of the first tri-state gate 112 and a second power input terminal of the second tri-state gate 113, respectively. An input terminal of the first tri-state gate 112 is electrically connected to the upper-stage shift signal input terminal IN, and an output terminal of the first tri-state gate 112 is electrically connected to an output terminal of the second tri-state gate 113 and a first input terminal of the NOR gate 114, respectively. A second input terminal of the NOR gate 114 is electrically connected to the reset terminal RST, and an output terminal of the NOR gate 114 is electrically connected to an input terminal of the second tri-state gate 113 and the lower-stage shift signal output terminal NEXT, respectively.

It is to be noted that FIG. 9 only illustrates one setting of the latch circuit 11, but the present application is not limited thereto. Those skilled in the art may set the latch circuit 11 according to actual demands.

The working principle of all structures of the present application will be specified below.

It is to be noted that In FIG. 9, the shift register is illustrated by using an example in which each shift register unit 10 includes two scan switch circuits 12 and two light emission control switch circuits 13. The two scan switch circuits 12 include a first scan switch circuit 121 and a second scan switch circuit 122. The first scan switch circuit 121 and the second scan switch circuit 122 are connected to the same scan signal input terminal SCANin. The first scan switch circuit 121 is electrically connected to the first scan signal output terminal SCAN1out, and the second scan switch circuit 122 is electrically connected to the second scan signal output terminal SCAN2out, where the first scan signal output terminal SCAN1out and the second scan signal output terminal SCAN2out output scan signals having the same waveform but different voltage ranges. The two light emission control circuits 13 include a first light emission control circuit 131 and a second light emission control circuit 132. A first input terminal of the first light emission control switch circuit 131 is electrically connected to the lower-stage shift signal output terminal NEXT, a second input terminal of the first light emission control switch circuit 131 is electrically connected to the first light emission control signal input terminal EMIT1in, and the output terminal of the first light emission control switch circuit 131 is electrically connected to the first light emission control signal input terminal EMIT1in. A first input terminal of the second light emission control switch circuit 132 is electrically connected to the lower-stage shift signal output terminal NEXT, a second input terminal of the second light emission control switch circuit 132 is electrically connected to the second light emission control signal input terminal EMIT2in, and an output terminal of the second light emission control switch circuit 132 is electrically connected to the second light emission control signal input terminal EMIT2in.

Figure 10:
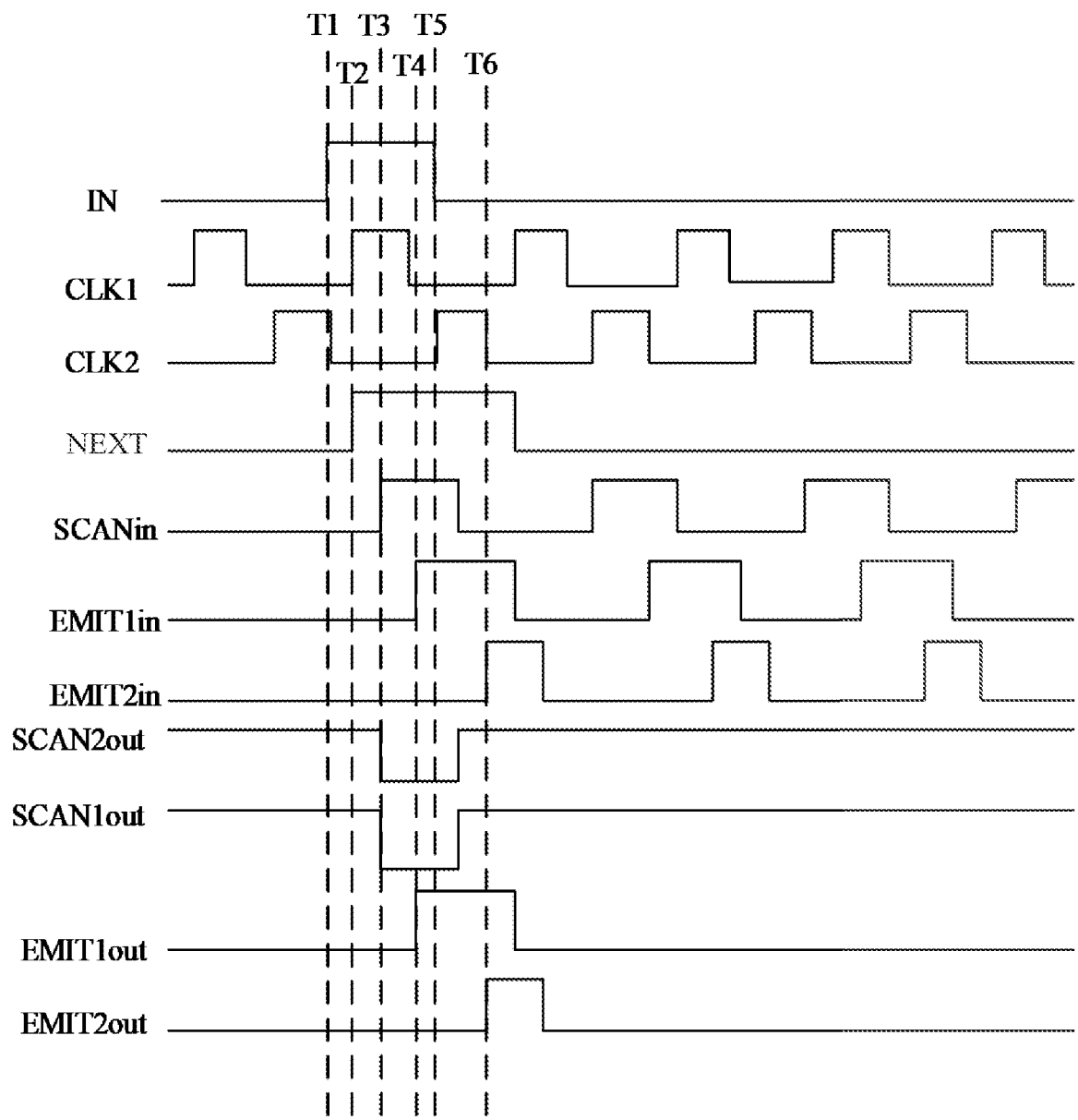
FIG. 10 is a timing diagram of a shift register unit according to an embodiment of the present disclosure.

FIG. 10 is a timing diagram of a shift register unit according to an embodiment of the present disclosure. In conjunction with FIGS. 9 and 10, between time T1 and time T2, when the upper-stage shift signal is a high level and the first clock signal is a low level, the latch circuit 11 latches the upper-stage shift signal of the previous stage and continues to output a low level at the lower-stage shift signal output terminal NEXT.

41—Between time T2 and time T3, when the upper-stage shift signal is a high level and the first clock signal is a high level, the third inverter 111 inverts the upper-stage shift signal inputted by the input terminal of the third inverter 111 and then outputs the inverted upper-stage shift signal. That is, the signal outputted by the output terminal of the third inverter 11 is a low level, is outputted to be a high level after passing through the NOR gate 114, then outputted to be a high level at the lower-stage shift signal output terminal NEXT, and finally latched.

Between time T3 and time T4, when the upper-stage shift signal is a high level and the first clock signal is a high level, in response to the high level of the lower-stage shift signal, the second scan switch circuit 122 transfers the scan signal inputted by the scan signal input terminal SCANin to the first buffer 14 (the number of inverters in the first buffer 14 is an odd number) and then outputs this scan signal through the second scan signal output terminal SCAN2out. At the same time, in response to the high level of the lower-stage shift signal, the first scan switch circuit 121 adjusts the voltage range of the scan signal inputted by the scan signal input terminal SCANin from being switched between a first potential V1 and a second potential V2 to being switched between a third potential V3 and a fourth potential V4, for example, the scan signal is adjusted from being switched between 0V to 5V to being switched between −5V and 5V, and then outputs the scan signal through the first scan signal output terminal SCAN1out. In this manner, such a setting facilitates the reset of the pixel circuit at a lower potential, thereby facilitating the improvement of the display effect.

Between time T4 and time T5, in response to the high level of the lower-stage shift signal, the first light emission control switch circuit 131 transmits the first light emission control signal inputted by the first light emission control signal input terminal EMIT1in to the second buffer 15 and then outputs the first light emission control signal through the first light emission control signal input terminal EMIT1out.

Between time T5 to time T6, when the upper-stage shift signal is a low level and the first clock signal is a low level, the lower-stage shift signal output terminal NEXT continues to output a high level signal. In response to the high level of the lower-stage shift signal, the second light emission control switch circuit 132 transmits the second light emission control signal inputted by the second light emission control signal input terminal EMIT2in to the second buffer 15 and then outputs the second light emission control signal through the second light emission control signal input terminal EMIT2out.

As a result, when the upper-stage shift signal is a high level, the clock signal passes the upper-stage shift signal into an input circuit and generates a high level signal to control the scan switch circuit 12 and the light emission control switch circuit 13 to be turned on. At this point, the scan signal inputted by the scan signal input terminal SCANin is outputted through the scan signal output terminal SCANout, and the light emission control signal inputted by the light emission control signal input terminal EMIT1in is outputted through the light emission control signal input terminal EMITout. Compared with the related art, in the embodiment, the output of the scan signal and the light emission control signal can be completed by setting one shift register which is simple in structure and occupies a small area. In addition, the waveform of the scan signal outputted by the scan signal output terminal SCAN1out is the same as the waveform of the scan signal inputted by the scan signal input terminal SCAN1in, and the waveform of the light emission control signal outputted by the light emission control signal output terminal EMITout is the same as the waveform of the light emission control signal inputted by the light emission control signal input terminal EMITin, so that the inputted and outputted signals can be arbitrarily converted to each other without being controlled by the clock signal, that is, the operation is flexible and not affected by any additional signals.

Figure 11:
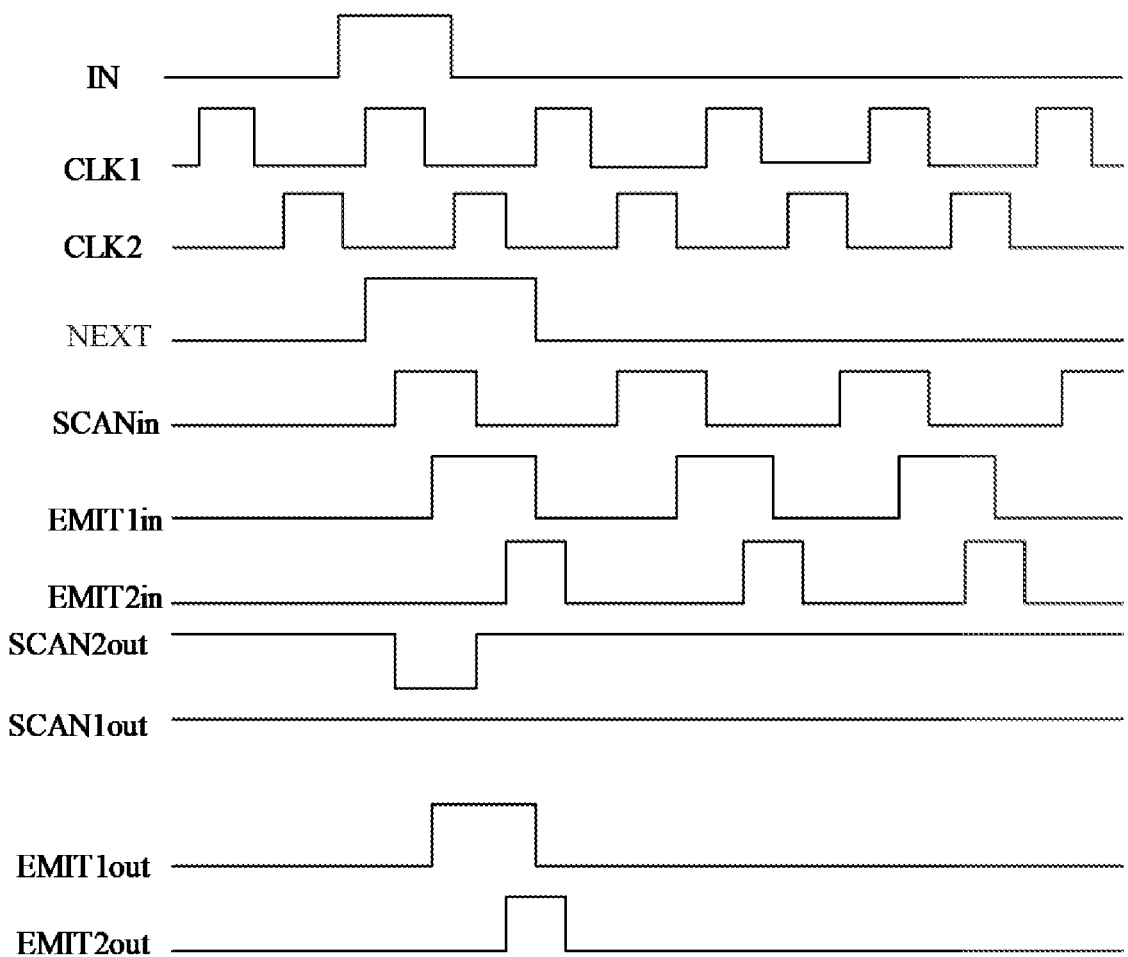
FIG. 11 is a timing diagram of another shift register unit according to an embodiment of the present disclosure.

FIG. 11 is a timing diagram of another shift register unit according to an embodiment of the present disclosure. Different from the timing in FIG. 10, in FIG. 11, the output of the first cutoff signal input terminal SBAR1 is 0, and the signal outputted by the second scan signal output terminal SCAN2out is a high level, while other signals remain unchanged. At this point, the conversion of different modes can be achieved, for example, the display device is converted from the 4T1C mode to the 2T1C mode.

Figure 12:
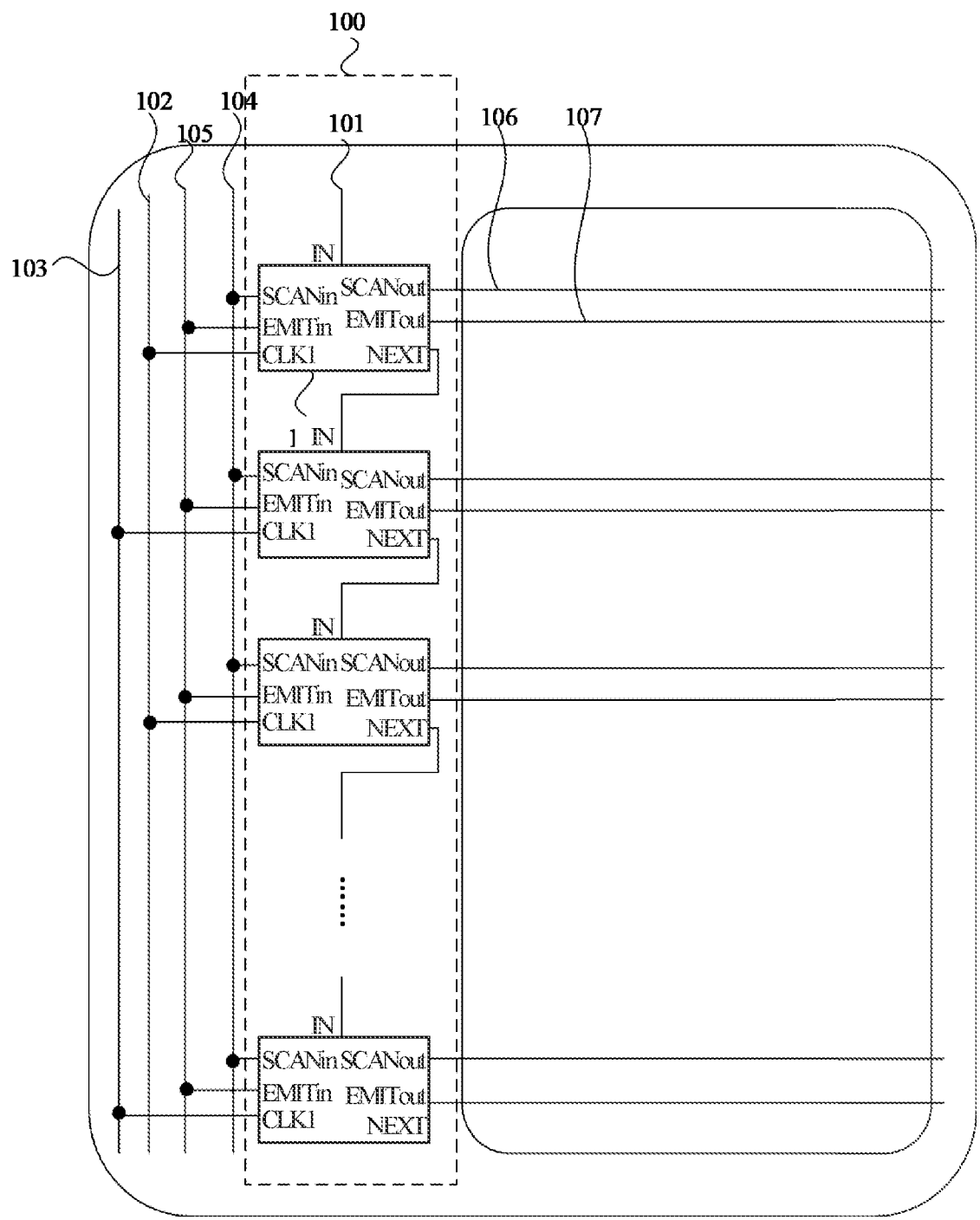
FIG. 12 is a structural diagram of a display panel according to an embodiment of the present disclosure.

Based on the same concept, an embodiment of the present disclosure further provides a display panel. For the content that is not described in detail in the display panel embodiments, reference may be made to the content in the preceding embodiments of the shift register. The details are not repeated here. FIG. 12 is a structural diagram of a display panel according to an embodiment of the present disclosure. As shown in FIG. 12, the display panel provided by the embodiment of the present disclosure includes a trigger signal line 101, a first clock signal line 102, a second clock signal line 103, at least one scan signal input line 104, at least one light emission control signal input line 104, at least one scan line 106, at least one light emission control signal line 107 and the shift register 100 described in the preceding embodiments. An upper-stage shift signal input terminal IN of a first-stage shift register unit 10 is electrically connected to the trigger signal line 101, and an upper-stage shift signal input terminal IN of a next-stage shift register unit 10 is electrically connected to a lower-stage shift signal output terminal NEXT of a previous-stage shift register unit 10. The first clock signal line 102 is electrically connected to a first clock signal input terminal CLK1 of an odd-number stage shift register unit 10, and the second clock signal line 103 is electrically connected to a second clock signal input terminal CLK2 of an even-number stage shift register unit 10. A scan signal output terminal SCANout of the shift register unit 10 is electrically connected to the scan line 106. A light emission control signal terminal EMITin of the shift register unit 10 is electrically connected to the light emission control signal line 107.

The shift signal is transferred by setting the latch circuit, and the shift signal may be used as the control signal of the scan switch circuit and the light emission control switch circuit. The scan switch circuit outputs the scan signal inputted by the scan signal input terminal through the scan signal output terminal according to the control signal, and the light emission control switch circuit outputs the light emission control signal inputted by the light emission control signal input terminal through the light emission control signal output terminal according to the control signal, that is, the switch circuit is configured to control whether the signal required by the pixel circuit is transmitted to the pixel circuit. Compared with the related art, in the embodiment, the output of the scan signal and the light emission control signal can be completed by setting one shift register which is simple in structure and occupies a small area, thereby facilitating the narrow border design of the display panel. Even if the display modes of the display panel are different, for example, the display mode is a normal mode, a rolling mode or a global mode, the structure of the display device can still be simple. In addition, the waveform of the scan signal outputted by the scan signal output terminal is the same as the waveform of the scan signal inputted by the scan signal input terminal, and the waveform of the light emission control signal outputted by the light emission control signal output terminal is the same as the waveform of the light emission control signal inputted by the light emission control signal input terminal, so that the inputted and outputted signals can be arbitrarily converted to each other without being controlled by the clock signal, that is, the operation is flexible and not affected by any additional signals, thereby facilitating the improvement of the display effect of the display panel.

Figure 13:
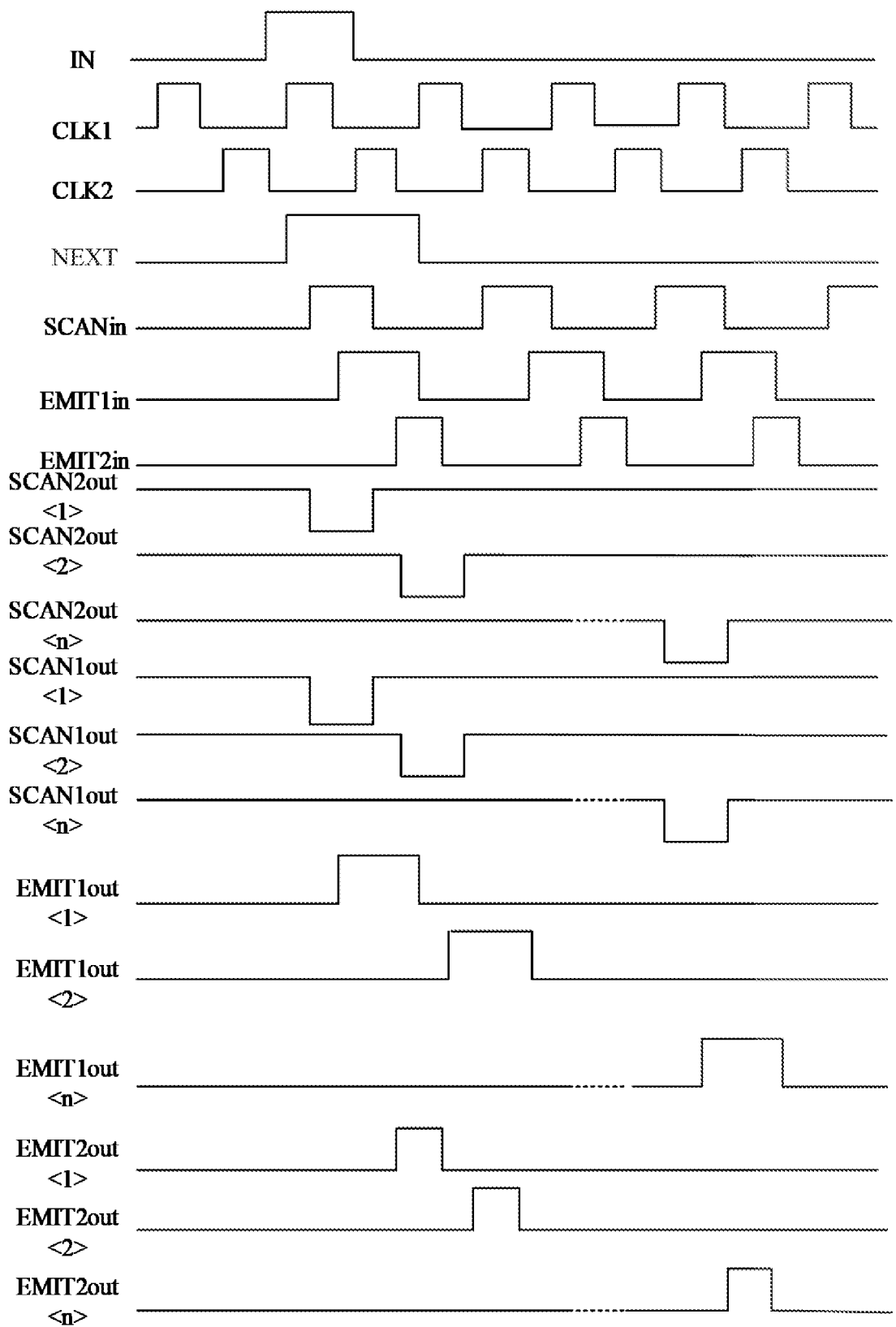
FIG. 13 is a timing diagram of a display panel according to an embodiment of the present disclosure.

FIG. 13 is a timing diagram of a display panel according to an embodiment of the present disclosure. As shown in FIG. 13, each scan signal is transmitted in stages, and each light emission control signal is transmitted in stages.

Based on the same concept, an embodiment of the present disclosure further provides a driving method of a display panel, which is applied to the display panel described in the above-mentioned embodiments. FIG. 14 is a flowchart of a driving method of a display panel according to an embodiment of the present disclosure. As shown in FIG. 14, the driving method of a display panel includes steps S110 and S120 described below.

In S110, a trigger signal is provided for the trigger signal line, a first clock signal is provided for the first clock signal line, and a second clock signal is provided for the second clock signal line, so that a latch circuit in a first-stage shift register unit to an $N^{th}$-stage shift register unit outputs a lower-stage shift signal to an upper-stage shift signal input terminal of a lower-stage shift register unit and outputs a lower-stage shift signal to the scan switch circuit and the light emission control switch circuit.

In S120, according to the lower-stage shift signal, a scan signal transmitted by the scan signal input line is outputted through the scan signal output terminal and a light emission control signal transmitted by the light emission control signal input line is outputted through the light emission control signal output terminal.

In the embodiment, the output of the scan signal and the light emission control signal can be completed by setting one shift register which is simple in structure and occupies a small area, thereby facilitating the narrow border design of the display panel. Even if the display modes of the display panel are different, for example, the display mode is a normal mode, a rolling mode or a global mode, the structure of the display device can still be simple. In addition, the waveform of the scan signal outputted by the scan signal output terminal is the same as the waveform of the scan signal inputted by the scan signal input terminal, and the waveform of the light emission control signal outputted by the light emission control signal output terminal is the same as the waveform of the light emission control signal inputted by the light emission control signal input terminal, so that the inputted and outputted signals can be arbitrarily converted to each other without being controlled by the clock signal, that is, the operation is flexible and not affected by any additional signals, thereby facilitating the improvement of the display effect of the display panel.

Based on the same concept, an embodiment of the present disclosure further provides a display device. The display device includes any display panel provided in the above-mentioned embodiments. For example, as shown in FIG. 15, the display device 1000 includes a display panel 1001. Therefore, the display device also has the beneficial effects of the display panel described in the above-mentioned embodiments, and for the same details, reference may be made to the description of the display panel. The details are not repeated here.

The display device 1000 provided in the embodiment of the present disclosure may be the phone shown in FIG. 15, or may be any electronic product with a display function. For example, the display device 1000 may be an augmented reality (AR) display device, a virtual reality (VR) display device, an in-vehicle display, a smart bracelet, industrial control equipment, a computer, a television or other electronic displays.

It is to be noted that the preceding are only preferred embodiments of the present disclosure and the technical principles used therein. It is to be understood by those skilled in the art that the present disclosure is not limited to the embodiments described herein. Those skilled in the art can make various apparent modifications, and substitutions without departing from the scope of the present disclosure. Therefore, while the present disclosure has been described in detail via the preceding embodiments, the present disclosure is not limited to the preceding embodiments and may include equivalent embodiments without departing from the concept of the present disclosure. The scope of the present disclosure is determined by the scope of the appended claims.

What is claimed is:

1. A shift register, comprising a plurality of shift register units that are cascaded, wherein
 each of the plurality of shift register units comprises a latch circuit, at least one scan switch circuit and at least one light emission control switch circuit; and each of the plurality of shift register units further comprises a respective clock signal input terminal of a plurality of clock signal input terminals, an upper-stage shift signal input terminal, a lower-stage shift signal output terminal, at least one scan signal input terminal, at least one light emission control signal input terminal, at least one scan signal output terminal and at least one light emission control signal output terminal;

wherein for the plurality of shift register units, the plurality of clock signal input terminals comprises a first clock signal input terminal and a second clock signal input terminal; a latch circuit in each of odd number-stage ones of the plurality of shift register units is electrically connected to the first clock signal input terminal, and a latch circuit in each of even number-stage ones of the plurality of shift register units is electrically connected to the second clock signal input terminal;

wherein for each of the plurality of shift register units, the latch circuit is electrically connected to the respective clock signal input terminal, the upper-stage shift signal input terminal and the lower-stage shift signal output terminal separately, and is configured to, in response to a clock signal inputted by the respective clock signal input terminal, latch an upper-stage shift signal inputted by the upper-stage shift signal input terminal and output the upper-stage shift signal through the lower-stage shift signal output terminal;

each of the at least one light emission control switch circuit is electrically connected to a respective one of the at least one light emission control signal input terminal, a respective one of the at least one light emission control signal output terminal and the lower-stage shift signal output terminal separately, and is configured to, in response to the lower-stage shift signal outputted by the lower-stage shift signal output terminal, output a light emission control signal inputted by the respective one of the at least one light emission control signal input terminal through the respective one of the at least one light emission control signal output terminal;

each of the at least one scan switch circuit is configured to, in response to a lower-stage shift signal outputted by the lower-stage shift signal output terminal, output a scan signal inputted by the respective one of the at least one scan signal input terminal through the respective one of the at least one scan signal output terminal; and each of the at least one scan switch circuit comprises a first NAND gate and a first voltage range adjustment unit, wherein a first input terminal of the first NAND gate and a first input terminal of the first voltage range adjustment unit are respectively connected to the lower-stage shift signal output terminal;

a second input terminal of the first NAND gate and a second input terminal of the first voltage range adjustment unit are respectively connected to the respective one of the at least one scan signal input terminal;

an output terminal of the first NAND gate is electrically connected to a third input terminal of the first voltage range adjustment unit; and an output terminal of the first voltage range adjustment unit is connected to the respective one of the at least one scan signal output terminal; and the first voltage range adjusting unit is configured to, in response to the lower-stage shift signal outputted by the lower-stage shift signal output terminal and the scan signal inputted by the respective one of the at least one scan signal input terminal, adjust a potential outputted by the first NAND gate from being switched between a first potential V1 and a second potential V2 to being switched between a third potential V3 and a fourth potential V4; wherein |V2−V1|<|V4−V3|.

2. The shift register according to claim 1, wherein the first voltage range adjusting unit comprises a first level converter, a second level converter, a second NAND gate and a first inverter; wherein an input terminal of the first level converter is electrically connected to the lower-stage shift signal output terminal, and an output terminal of the first level converter is electrically connected to a first input terminal of the second NAND gate;

an input terminal of the second level converter is electrically connected to the respective one of the at least one scan signal input terminal, and an output terminal of the second level converter is electrically connected to a second input terminal of the second NAND gate;

the output of the first NAND gate is electrically connected to a first power input terminal of the first inverter; and an output terminal of the second NAND gate is electrically connected to a second power input terminal of the first inverter, an input terminal of the first inverter is grounded, and an output terminal of the first inverter is electrically connected to the respective one of the at least one scan signal output terminal.

3. The shift register according to claim 2, further comprising a third NAND gate; wherein a first input terminal of the third NAND gate is electrically connected to the lower-stage shift signal output terminal, and a second input terminal of the third NAND gate and the second input terminal of the first NAND gate are electrically connected to a same scan signal input terminal; and an output terminal of the third NAND gate and the input terminal of the first inverter are electrically connected to different scan signal output terminals.

4. The shift register according to claim 2, further comprising a first cutoff signal input terminal;

wherein the first cutoff signal input terminal is electrically connected to a third input terminal of the first NAND gate.

5. The shift register according to claim 1, wherein each of the plurality of shift register units further comprises at least one first buffer and at least one second buffer; wherein each of the at least one first buffer corresponds to a respective one of the at least one scan switch circuit, and each of the at least one second buffer corresponds to a respective one of the at least one light emission control switch circuit;

each of the at least one first buffer is located between the respective one of the at least one scan switch circuit and the respective one of the at least one scan signal output terminal; and each of the at least one second buffer is located between the respective one of the at least one light emission control switch circuit and the respective one of the at least one light emission control signal output terminal.

6. The shift register according to claim 1, wherein the latch circuit comprises a third inverter, a first tri-state gate, a second tri-state gate and a NOR gate; and each of the plurality of shift register units further comprises a reset terminal, wherein the reset terminal is configured to transmit a reset signal;

wherein an input terminal of the third inverter, a first power input terminal of the second tri-state gate and a second power input terminal of the first tri-state gate are electrically connected to the clock signal input terminal, respectively, and an output terminal of the third inverter is electrically connected to a first power input terminal of the first tri-state gate and a second power input terminal of the second tri-state gate, respectively;

an input terminal of the first tri-state gate is electrically connected to the upper-stage shift signal input terminal, and an output terminal of the first tri-state gate is electrically connected to an output terminal of the second tri-state gate and a first input terminal of the NOR gate, respectively; and a second input terminal of the NOR gate is electrically connected to the reset terminal, and an output terminal of the NOR gate is electrically connected to an input terminal of the second tri-state gate and the lower-stage shift signal output terminal, respectively.

7. A display panel, comprising a trigger signal line, a first clock signal line, a second clock signal line, at least one scan signal input line, at least one light emission control signal input line, at least one scan line, at least one light emission control signal line and the shift register according to claim 1;

wherein an upper-stage shift signal input terminal of a first-stage shift register unit is electrically connected to the trigger signal line, and an upper-stage shift signal input terminal of a next-stage shift register unit is electrically connected to a lower-stage shift signal output terminal of a previous-stage shift register unit;

the first clock signal line is electrically connected to a first clock signal input terminal of an odd-number stage shift register unit, and the second clock signal line is electrically connected to a second clock signal input terminal of an even-number stage shift register unit;

a scan signal output terminal of each of the plurality of shift register units is electrically connected to the at least one scan line; and a light emission control signal terminal of each of the plurality of shift register units is electrically connected to the at least one light emission control signal line.

8. A driving method of a display panel, applied to the display panel according to claim 7 and comprising:

providing a trigger signal for the trigger signal line, providing a first clock signal for the first clock signal line, and providing a second clock signal for the second clock signal line so that a latch circuit in a first-stage shift register unit to an $N^{th}$-stage shift register unit outputs a lower-stage shift signal to an upper-stage shift signal input terminal of a lower-stage shift register unit and outputs a lower-stage shift signal to the at least one scan switch circuit and the at least one light emission control switch circuit; and according to the lower-stage shift signal, outputting a scan signal transmitted by the at least one scan signal input line through the scan signal output terminal and outputting a light emission control signal transmitted by the at least one light emission control signal input line through the light emission control signal output terminal.

9. A display device, comprising the display panel according to claim 7.

10. A shift register, comprising a plurality of shift register units that are cascaded, wherein each of the plurality of shift register units comprises a latch circuit, at least one scan switch circuit and at least one light emission control switch circuit; and each of the plurality of shift register units further comprises a respective clock signal input terminal of a plurality of clock signal input terminals, an upper-stage shift signal input terminal, a lower-stage shift signal output terminal, at least one scan signal input terminal, at least one light emission control signal input terminal, at least one scan signal output terminal and at least one light emission control signal output terminal;

wherein for the plurality of shift register units, the plurality of clock signal input terminals comprises a first clock signal input terminal and a second clock signal input terminal; a latch circuit in each of odd number-stage ones of the plurality of shift register units is electrically connected to the first clock signal input terminal, and a latch circuit in each of even number-stage ones of the plurality of shift register units is electrically connected to the second clock signal input terminal;

wherein for each of the plurality of shift register units, the latch circuit is electrically connected to the respective clock signal input terminal, the upper-stage shift signal input terminal and the lower-stage shift signal output terminal separately, and is configured to, in response to a clock signal inputted by the respective clock signal input terminal, latch an upper-stage shift signal inputted by the upper-stage shift signal input terminal and output the upper-stage shift signal through the lower-stage shift signal output terminal;

each of the at least one scan switch circuit is electrically connected to a respective one of the at least one scan signal input terminal, a respective one of the at least one the scan signal output terminal and the lower-stage shift signal output terminal separately, and is configured to, in response to a lower-stage shift signal outputted by the lower-stage shift signal output terminal, output a scan signal inputted by the respective one of the at least one scan signal input terminal through the respective one of the at least one scan signal output terminal each of the at least one light emission control switch circuit is configured to, in response to the lower-stage shift signal outputted by the lower-stage shift signal output terminal, output a light emission control signal inputted by the respective one of the at least one light emission control signal input terminal through the respective one of the at least one light emission control signal output terminal; and each of the at least one light emission control switch circuit comprises a fourth NAND gate and a second voltage range adjustment unit, wherein a first input terminal of the fourth NAND gate and a first input terminal of the second voltage range adjustment unit are respectively connected to the lower-stage shift signal output terminal;

a second input terminal of the fourth NAND gate and a second input terminal of the second voltage range adjustment unit are respectively connected to a respective one of the at least one light emission control signal input terminal, an output terminal of the fourth NAND gate is electrically connected to a third input terminal of the second voltage range adjustment unit; and an output terminal of the second voltage range adjustment unit is electrically connected to the light emission control signal output terminal; and the second voltage range adjusting unit is configured to, in response to the lower-stage shift signal outputted by the lower-stage shift signal output terminal and the light emission control signal inputted by the respective one of the at least one light emission control signal input terminal, adjust a potential outputted by the fourth NAND gate from being switched between a fifth potential V5 and a sixth potential V6 to being switched between a seventh potential V7 and an eighth potential V8; wherein |V6−V7|<|V8−V7|.

11. The shift register according to claim 10, wherein the second voltage range adjusting unit comprises a third level converter, a fourth level converter, a fifth NAND gate and a second inverter;
wherein an input terminal of the third level converter is electrically connected to the lower-stage shift signal output terminal, and an output terminal of the third level converter is electrically connected to a first input terminal of the fifth NAND gate;
an input terminal of the fourth level converter is electrically connected to the respective one of the at least one light emission control signal input terminal, and an output terminal of the fourth level converter is electrically connected to a second input terminal of the fifth NAND gate;
the output terminal of the fourth NAND gate is electrically connected to a first power input terminal of the second inverter; and
an output terminal of the fifth NAND gate is electrically connected to a second power input terminal of the second inverter, a control terminal of the second inverter is grounded, and an output terminal of the second inverter is electrically connected to the respective one of the at least one light emission control signal output terminal.

12. The shift register according to claim 11, further comprising a second cutoff signal input terminal;
wherein the second cutoff signal input terminal is electrically connected to a third input terminal of the fourth NAND gate.

13. The shift register according to claim 10, wherein each of the plurality of shift register units further comprises at least one first buffer and at least one second buffer; wherein each of the at least one first buffer corresponds to a respective one of the at least one scan switch circuit, and each of the at least one second buffer corresponds to a respective one of the at least one light emission control switch circuit;
each of the at least one first buffer is located between the respective one of the at least one scan switch circuit and the respective one of the at least one scan signal output terminal; and
each of the at least one second buffer is located between the respective one of the at least one light emission control switch circuit and the respective one of the at least one light emission control signal output terminal.

14. The shift register according to claim 10, wherein the latch circuit comprises a third inverter, a first tri-state gate, a second tri-state gate and a NOR gate; and
each of the plurality of shift register units further comprises a reset terminal, wherein the reset terminal is configured to transmit a reset signal;
wherein an input terminal of the third inverter, a first power input terminal of the second tri-state gate and a second power input terminal of the first tri-state gate are electrically connected to the clock signal input terminal, respectively, and an output terminal of the third inverter is electrically connected to a first power input terminal of the first tri-state gate and a second power input terminal of the second tri-state gate, respectively;
an input terminal of the first tri-state gate is electrically connected to the upper-stage shift signal input terminal, and an output terminal of the first tri-state gate is electrically connected to an output terminal of the second tri-state gate and a first input terminal of the NOR gate, respectively; and
a second input terminal of the NOR gate is electrically connected to the reset terminal, and an output terminal of the NOR gate is electrically connected to an input terminal of the second tri-state gate and the lower-stage shift signal output terminal, respectively.

15. A display panel, comprising a trigger signal line, a first clock signal line, a second clock signal line, at least one scan signal input line, at least one light emission control signal input line, at least one scan line, at least one light emission control signal line and the shift register according to claim 10;
wherein an upper-stage shift signal input terminal of a first-stage shift register unit is electrically connected to the trigger signal line, and an upper-stage shift signal input terminal of a next-stage shift register unit is electrically connected to a lower-stage shift signal output terminal of a previous-stage shift register unit;
the first clock signal line is electrically connected to a first clock signal input terminal of an odd-number stage shift register unit, and the second clock signal line is electrically connected to a second clock signal input terminal of an even-number stage shift register unit;
a scan signal output terminal of each of the plurality of shift register units is electrically connected to the at least one scan line; and
a light emission control signal terminal of each of the plurality of shift register units is electrically connected to the at least one light emission control signal line.

16. A driving method of a display panel, applied to the display panel according to claim 15 and comprising:
providing a trigger signal for the trigger signal line, providing a first clock signal for the first clock signal line, and providing a second clock signal for the second clock signal line so that a latch circuit in a first-stage shift register unit to an $N^{th}$-stage shift register unit outputs a lower-stage shift signal to an upper-stage shift signal input terminal of a lower-stage shift register unit and outputs a lower-stage shift signal to the at least one scan switch circuit and the at least one light emission control switch circuit; and
according to the lower-stage shift signal, outputting a scan signal transmitted by the at least one scan signal input line through the scan signal output terminal and outputting a light emission control signal transmitted by the at least one light emission control signal input line through the light emission control signal output terminal.

17. A display device, comprising the display panel according to claim 15.

* * * * *